US008096676B2

(12) United States Patent
Gladnick et al.

(10) Patent No.: US 8,096,676 B2
(45) Date of Patent: Jan. 17, 2012

(54) HIGH INTENSITY PULSED LIGHT SOURCE CONFIGURATIONS

(75) Inventors: Paul Gladnick, Seattle, WA (US); Yuhua Ding, Bothell, WA (US)

(73) Assignee: Mitutoyo Corporation, Kawasaki-shi (JP)

( * ) Notice: Subject to any disclaimer, the term of this patent is extended or adjusted under 35 U.S.C. 154(b) by 1 day.

(21) Appl. No.: 12/764,893

(22) Filed: Apr. 21, 2010

(65) Prior Publication Data
US 2010/0208486 A1 Aug. 19, 2010

Related U.S. Application Data

(63) Continuation-in-part of application No. 12/628,100, filed on Nov. 30, 2009, which is a continuation-in-part of application No. 12/255,566, filed on Oct. 21, 2008, now abandoned.

(51) Int. Cl.
*F21V 9/00* (2006.01)

(52) U.S. Cl. .......... 362/231; 362/551; 362/84; 362/293; 362/317; 353/20; 353/31

(58) Field of Classification Search .................. 362/231, 362/84, 277, 278, 551, 282, 317, 324, 293; 353/20, 31; 356/609
See application file for complete search history.

(56) References Cited

U.S. PATENT DOCUMENTS

| 6,066,861 | A | 5/2000 | Höhn |
|---|---|---|---|
| 6,255,670 | B1 | 7/2001 | Srivastava |
| 6,417,019 | B1 | 7/2002 | Mueller |
| 6,641,448 | B2 | 11/2003 | Wang |
| 6,765,237 | B1 | 7/2004 | Doxsee |
| 6,835,112 | B2 | 12/2004 | Tanabe |
| 7,026,755 | B2 | 4/2006 | Setlur |
| 7,083,490 | B2 | 8/2006 | Mueller |
| 7,088,038 | B2 | 8/2006 | Srivastava |

(Continued)

FOREIGN PATENT DOCUMENTS

EP 2 169 964 A2 3/2010

(Continued)

OTHER PUBLICATIONS

Emtman,C., et al., "Phospor Wheel Configuration for High Intensity Point Source," U.S. Appl. No. 12/823,050, filed Jun. 24, 2010.

(Continued)

*Primary Examiner* — Ali Alavi
(74) *Attorney, Agent, or Firm* — Christensen O'Connor Johnson Kindness PLLC

(57) ABSTRACT

A high-intensity light source configuration has a long lifetime and can be modulated at a high rate. The configuration includes a movable member mounted to an actuator; a light-emitting phosphor region associated with the movable member; an input light source that illuminates the light-emitting phosphor region at a spot that is fixed relative to an emitted light output region; and a light source controller controlling the movable member actuator and the input light source. The input light source (e.g., laser) provides high-intensity input light to the illuminated spot, causing the light-emitting phosphor region to emit high-intensity output light. The light-emitting phosphor region is moved relative to the illuminated spot so as to reduce optical quenching and photobleaching, to thereby extend the life of the light source configuration. The phosphor region may emit broadband light and/or may include respective sub-regions having phosphors that emit respective peak wavelengths.

37 Claims, 11 Drawing Sheets

U.S. PATENT DOCUMENTS

| | | |
|---|---|---|
| 7,112,921 B2 | 9/2006 | Menkara |
| 7,235,792 B2 | 6/2007 | Elofson |
| 7,279,832 B2 | 10/2007 | Thurk |
| 7,354,785 B2 | 4/2008 | Kabay |
| 7,547,114 B2 * | 6/2009 | Li et al. .................. 362/231 |
| 2005/0105565 A1 | 5/2005 | Tobiason |
| 2005/0208302 A1 | 9/2005 | Yi |
| 2005/0255629 A1 | 11/2005 | Han |
| 2006/0097621 A1 | 5/2006 | Park |
| 2006/0109483 A1 | 5/2006 | Marx |
| 2006/0282137 A1 | 12/2006 | Nightingale |
| 2007/0019408 A1 | 1/2007 | McGuire, Jr. |
| 2009/0015157 A1 | 1/2009 | Sun |
| 2009/0034284 A1 | 2/2009 | Li |
| 2009/0284148 A1 | 11/2009 | Iwanaga |
| 2010/0001256 A1 | 1/2010 | Coe-Sullivan |
| 2010/0079730 A1 | 4/2010 | Shibasaki |
| 2010/0097779 A1 | 4/2010 | Gladnick |

FOREIGN PATENT DOCUMENTS

| | | |
|---|---|---|
| WO | 2006/133214 A2 | 12/2006 |
| WO | 2009/017992 A1 | 2/2009 |

OTHER PUBLICATIONS

Gosnell, J.D., et al., "Cadmium Selenide Nanocrystals as White-Light Phosphors," Sixth International Conference on Solid State Lighting, San Diego, Calif., Aug. 14, 2006, Proceedings of the SPIE [Society of Photographic Instrumentation Engineers] 6337:63370A-1-63370A-9, 2006, pp. 1-9.

Happek, U., "Development of Efficient UV-LED Phosphor Coatings of Energy Saving Solid State Lighting," Final Report, The University of Georgia Department of Physics and Astronomy, Athens, Ga., Jan. 2007, 23 pages.

"Green Slim Projector XJ-A255/A250," Casio International, © 2010 Casio Computer Co., Ltd., Tokyo, <http://www.casio-intl.com/projector/xj_a255_250/> [retrieved May 26, 2010], 7 pages.

Happek, U., "Development of Efficient UV-LED Phosphor Coatings of Energy Saving Solid State Lighting," Final Report, DE-FC26-04NT41956, University of Georgia Department of Physics and Astronomy, Athens, Georgia, Jan. 2007.

European Search Report mailed Dec. 3, 2010, in corresponding EP Application No. 10 16 0735, filed Apr. 22, 2010, 2 pages.

* cited by examiner

HIGH INTENSITY PULSED LIGHT SOURCE CONFIGURATIONS

CROSS-REFERENCE(S) TO RELATED APPLICATION(S)

This application is a continuation-in-part of U.S. patent application Ser. No. 12/628,100 filed Nov. 30, 2009, which is a continuation-in-part of U.S. patent application Ser. No. 11/255,566, filed Oct. 21, 2008, priority from the filing dates of which is hereby claimed under 35 U.S.C. §120.

FIELD OF THE INVENTION

The invention relates generally to light sources, and more particularly to high-intensity and stable broadband and/or multi-wavelength light sources suitable for use in precision measurement instruments, such as chromatic point sensors.

BACKGROUND OF THE INVENTION

Various uses are known for high-intensity broadband light sources. For example, it is known to use such light sources with chromatic confocal techniques in optical height sensors. In such an optical height sensor, as described in U.S. Patent Application Publication No. 2006/0109483 A1, which is incorporated herein by reference in its entirety, an optical element having axial chromatic aberration, also referred to as axial or longitudinal chromatic dispersion, may be used to focus a broadband light source such that the axial distance to the focus varies with the wavelength. Thus, only one wavelength will be precisely focused on a surface, and the surface height or position relative to the focusing element determines which wavelength is best focused. Upon reflection from the surface, the light is refocused onto a small detector aperture, such as a pinhole or the end of an optical fiber. Upon reflection from a surface and passing back through the optical system to the in/out fiber, only the wavelength that is well focused on the surface is well focused on the fiber. All of the other wavelengths are poorly focused on the fiber, and so will not couple power efficiently into the fiber. Therefore, for the light returned through the fiber, the signal level will be greatest for the wavelength corresponding to the surface height or position of the surface. A spectrometer type detector measures the signal level for each wavelength in order to determine the surface height.

Certain manufacturers refer to practical and compact systems that operate as described above, and that are suitable for chromatic confocal ranging in an industrial setting, as chromatic point sensors (CPS). A compact chromatically dispersive optical assembly that is used with such systems is referred to as an "optical pen." The optical pen is connected through the optical fiber to an electronic portion of the CPS, which transmits light through the fiber to be output from the optical pen and provides the spectrometer that detects and analyzes the returned light.

In known implementations, a continuous wave Xenon arc lamp is typically used as a high intensity broadband (e.g., white) light source for a CPS having the measurement rate on the order of 30 kHz. A Xenon arc lamp provides broadband light emission that covers the spectral range, and hence the height measurement range, of a CPS. It is also a high intensity light source with sufficient energy for obtaining a good S/N ratio at the measurement rate of about 30 kHz and the readout time of about 33 μs (=1/30×10$^{-3}$). However, in practical applications, a Xenon arc lamp exhibits certain undesirable characteristics, such as a less than desirable lifetime and arc spatial stability. A spatially stable, long lifetime light source is desirable in order to minimize any variation in CPS calibration due to changes in the light source spectral emission with arc movement, and also to minimize the downtime of a CPS. Further, many manufactured workpieces include hybrid materials, which have different reflectance characteristics and thus are saturated at different brightnesses. Thus, a CPS light source can preferably be brightness modulated (e.g., from less to more brightness) at a rate equal to or greater than the CPS measurement rate (e.g., 30 kHz) to allow measurement of hybrid materials. Such high rate light modulation is not practical with known Xenon arc lamps. Similar light source deficiencies are also found in association with other instrument applications, such as spectrometers, and the like.

SUMMARY OF THE INVENTION

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with various exemplary embodiments of the present invention, a high intensity light source configuration is provided, which has a stable, long lifetime. The invention may further provide a method of operating such light source configuration. In various exemplary embodiments, a high intensity light source configuration includes a movable member mounted to a movable member actuator; at least one light-emitting phosphor region associated with the movable member; an input light source configured to illuminate the light-emitting phosphor region(s) at an illuminated spot that is fixed relative to an emitted light output coupling region; and a light source controller operably connected to the movable member actuator and the input light source. In operation, the input light source (e.g., laser) may provide a high-intensity input light to the illuminated spot to thereby cause the light-emitting phosphor region(s) to emit high-intensity output light from an excited phosphor spot or track included in an emitted light output coupling region. In various embodiments, the emitted light output coupling region may be located proximate to the illuminated spot. At the same time, with the operation of the movable member actuator, the light-emitting phosphor region(s) continuously moves relative to the illuminated spot so as to reduce optical quenching of the emission, and photobleaching of the phosphor region(s), to thereby avoid quenching from high photon flux in the emitted light output coupling region and also to extend the life of the phosphor region(s) and hence the overall operating life of the light source configuration. It will be understood that optical quenching and/or photobleaching and/or lifetime considerations may depend on the basic phosphor light emitter and/or related additives and/or the binder or encapsulant characteristics associated with the phosphor material in various embodiments. In some embodiments, the light source can be modulated at a rate equal to or greater than a typical measurement rate of a CPS or other precision measurement instrument.

In accordance with one aspect of the present invention, a light-emitting phosphor region or unique sub-region associated with the movable member is distributed over an area of at least several times a nominal area of the emitted light output coupling region. In some embodiments and/or applications, it may be advantageous to distribute each light emitting phosphor region and/or sub-region over an area of at least 25 times, or 50 times or more, the area of the excited phosphor spot or track and/or the emitted light output coupling region, in order to extend the life of the light source configuration to a desirable level. In some embodiments suitable for more demanding applications, it may be advantageous to distribute a light emitting phosphor region over an area of at least 100 times, 200 times or even 500 or many more times the area of the emitted light output coupling region, in order to extend the life of the light source configuration to a desirable level.

In accordance with another aspect of the present invention, in some embodiments, the input light source may be configured to provide an average intensity at the illuminated spot of at least 1 milliwatts/mm$^2$ for relatively larger illuminated spots or at least 20 milliwatts/mm$^2$ for smaller illuminated spots, or at least 2000 milliwatts/mm$^2$ for even smaller illuminated spots, which is sufficient to cause the light-emitting phosphor region(s) to emit a level of output light that is useful in some applications. In more demanding applications (e.g., for very short measurement cycles, or the like) it may be advantageous when the input light source is configured to provide an average intensity of at least 200 milliwatts/mm$^2$, 5000 milliwatts/mm$^2$, or even 100 W/mm$^2$ or more at relatively smaller illuminated spots, in order to cause the light-emitting phosphor region(s) to emit a desirable level of high-intensity output light.

In accordance with a further aspect of the present invention, in some embodiments, the light source controller may be configured to operate the input light source with at least one short pulse duration, which may correspond to a an exposure time or measurement cycle of a measurement instrument which uses the light source configuration (e.g., a pulse duration that is at most 50 microseconds, 33 microseconds, or the like). In accordance with a further aspect of the invention, in some embodiments, the light source controller may be configured to operate the input light source with a pulse, or a periodic output, that includes amplitude control or modulation of the pulse or periodic output (e.g., such as sinusoidal, triangular or trapezoidal amplitude modulation, etc.)

In accordance with another aspect of the present invention, in some embodiments, the light source controller may be configured to operate the movable member actuator to provide at least one speed of the light-emitting phosphor region(s) across the illuminated spot and the emitted light output coupling region, including a speed that is at least 2.5 m/s, 5 m/s, 7.5 m/s, 10 m/s, or even 50 m/s or more, in various embodiments and/or applications.

In accordance with another aspect of the present invention, in some embodiments, the illuminated spot may have a nominal spot diameter of at most 150 microns proximate to a surface of the light-emitting phosphor region(s), and the associated excited phosphor spot or track may have a diameter or track width of at most 750 microns, in order to facilitate a compact light source configuration. In other embodiments, it may be advantageous if the illuminated spot has a nominal spot diameter of at most 100 microns, 50 micron, or even 20 microns or less, proximate to a surface of the light-emitting phosphor region(s), and the associated excited phosphor spot or track may have a diameter or track width of at most 500 microns, 300 microns, or even 200 microns or less, in order to facilitate an even more compact and/or economical light source configuration. However, these embodiments are exemplary only, and not limiting. In accordance with another aspect of the invention, the light source configuration may include an optical fiber, and an entrance aperture of the optical fiber may be located to receive light from the emitted light output coupling region. In accordance with another aspect of the present invention, in some embodiments, the entrance aperture of the optical fiber may be located at a distance of at most 2.0 millimeter, or 1.0 millimeter, or at most 500 microns, or 300 microns or less, from the excited phosphor spot or track, in order to efficiently receive light in the emitted light output coupling region.

In accordance with another aspect of the present invention, in some embodiments, the excited phosphor spot may have a diameter DEP and/or the emitted light output coupling region may have a diameter DR, and the light-emitting phosphor region(s) may have an emission time (i.e., decay time) of approximately TE, and the light-emitting phosphor region(s) may be moved across the illuminated spot at a speed selected in the range of approximately DEP/TE to DEP/(2*TE), and/or in the range DR/TE to DR/(2*TE), or the like. In such a case, most of the emitted light available from an emitting surface location may be emitted proximate to the entrance aperture of an output optical path, while at the same time, a fresh portion of the phosphor region(s) may be positioned to fill much of the illuminated spot.

In accordance with a further aspect of the invention, in some embodiments, the light-emitting phosphor region(s) associated with the movable member may be distributed on a reflective surface, and the exit aperture of an input optical path (e.g., an optical fiber) and the entrance aperture of an output optical path (e.g., an optical fiber) are located on the same side of the light-emitting phosphor region(s). In some embodiments, the exit aperture of the input optical path and the entrance aperture of the output optical path may be the same aperture.

In accordance with a further aspect of the invention, in some embodiments, a plurality of input light sources (e.g., a plurality of diode lasers) may be configured to illuminate the light emitting phosphor region(s) at adjacent or overlapping illuminated spots that are fixed relative to the emitted light output coupling region, to economically achieve higher intensities. In accordance with another aspect of the invention, in some embodiments, some input light sources may be configured to direct respective wavelengths of illumination directly or indirectly to the emitted light output coupling region or another location where they can be added to the wavelengths output by the light emitting phosphor region(s), in order to augment the wavelength spectrum output of a light source according to this invention.

In accordance with a further aspect of the invention, in some embodiments, at least one light-emitting phosphor region included on the movable member may comprise a phosphor material that emits broadband light. In accordance with a further aspect of the invention, in some embodiments, the light source configuration may comprise a plurality of respective light-emitting phosphor sub-regions located at different portions of the movable member, which comprise different respective phosphor materials that emit light with different respective peak wavelengths in response to the input light at the illuminated spot. In some embodiments, light-emitting phosphor regions or sub-regions may comprise one or more conventional phosphor materials such as YAG-Ce$^+$-based phosphors, or photoluminescent semiconductor nanoparticles or nanocrystals, or Q-particle phosphors (commonly called quantum dots or semiconductor quantum dots), or zinc oxide nanorods, or the like. The light source configuration may be configured such that the movable member may be moved relative to the illuminated spot such that each of the plurality of light-emitting phosphor sub-regions may be individually illuminated at various times.

In some embodiments, the movable member rotates about a rotation axis and the plurality respective light-emitting phosphor sub-regions comprise areas arranged at a shared radius from the rotation axis and covering respective angular ranges about the rotation axis, such that rotation of the moveable member moves the various sub-regions sequentially across a location where the first illuminated spot occurs. In other embodiments, the plurality respective light-emitting phosphor sub-regions comprise areas arranged along respective concentric tracks.

In accordance with a further aspect of the invention, in some embodiments, the light source configuration may comprise an output light path optical element set that includes at least one entrance aperture located to receive light from the emitted light output coupling region. In some embodiments, the output light path optical element set may comprise at least two optical output fibers and at least two entrance apertures positioned at different locations with respect to the illuminated spot. In some embodiments, the light emitted by the movable member may comprise a unique wavelength from a phosphor region or sub-region, or light from multiple phosphor sub-regions may be emitted simultaneously and combined to create a desired spectral profile. In some embodiments, the light source controller may control the time that the input light is provided to be synchronized with the presence of a particular respective light-emitting phosphor sub-region, or set of sub-regions, at the location of an illuminated spot in order to provide a desired spectral profile.

In some embodiments, the light source configuration may comprise a light gathering mirror that generally surrounds the emitted light output coupling region and reflects and concentrates the emitted light to the entrance aperture of the output light path optical element set. In one embodiment, the light gathering mirror may comprise an ellipsoidal mirror positioned with the illuminated spot approximately at one focus of the ellipsoid and the entrance aperture of the output light path optical element at the other focus of the ellipsoid. In another embodiment, the light gathering mirror may comprise an off-axis paraboloid mirror positioned to transfer the image of the illuminated spot to the entrance aperture of the output light path optical element. Various different light gathering mirrors may be configured to image the illuminated spot with a desired magnification (e.g., a magnification of 1 for a miniature system and/or a single output fiber, or a magnification of 10 for an output fiber bundle, and so on.) In any case, a light gathering mirror allows a higher proportion of light emitted from the movable member to be collected and directed through the entrance aperture.

It should be appreciated that various embodiments of the invention provide a particularly compact and economical means for coupling high intensity light into the end of an optical fiber. This is particularly valuable in applications (e.g., CPS applications, collimated light projectors, and the like) that benefit from a high intensity "ideal point source," in that the output end of the optical fiber may provide an economical point source that is nearly ideal (that is, it has a very small dimension) for many applications. Furthermore, various embodiments are able to provide various wavelength spectra with improved versatility and economy compared to known methods for providing various spectra from a point source. Furthermore, various embodiments may be able to provide various pulse durations for various wavelength spectra with improved versatility and economy compared to known methods for providing various pulsed spectra from a point source.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENTS

To provide context, the following generally describes light source configurations according to various exemplary embodiments disclosed herein as applied in chromatic point sensor (CPS) systems. It should be apparent to those skilled in the art, however, that such light source configurations may be applied equally well in various other systems, such as other precision measurement instruments (e.g., spectrometers).

Figure 1:
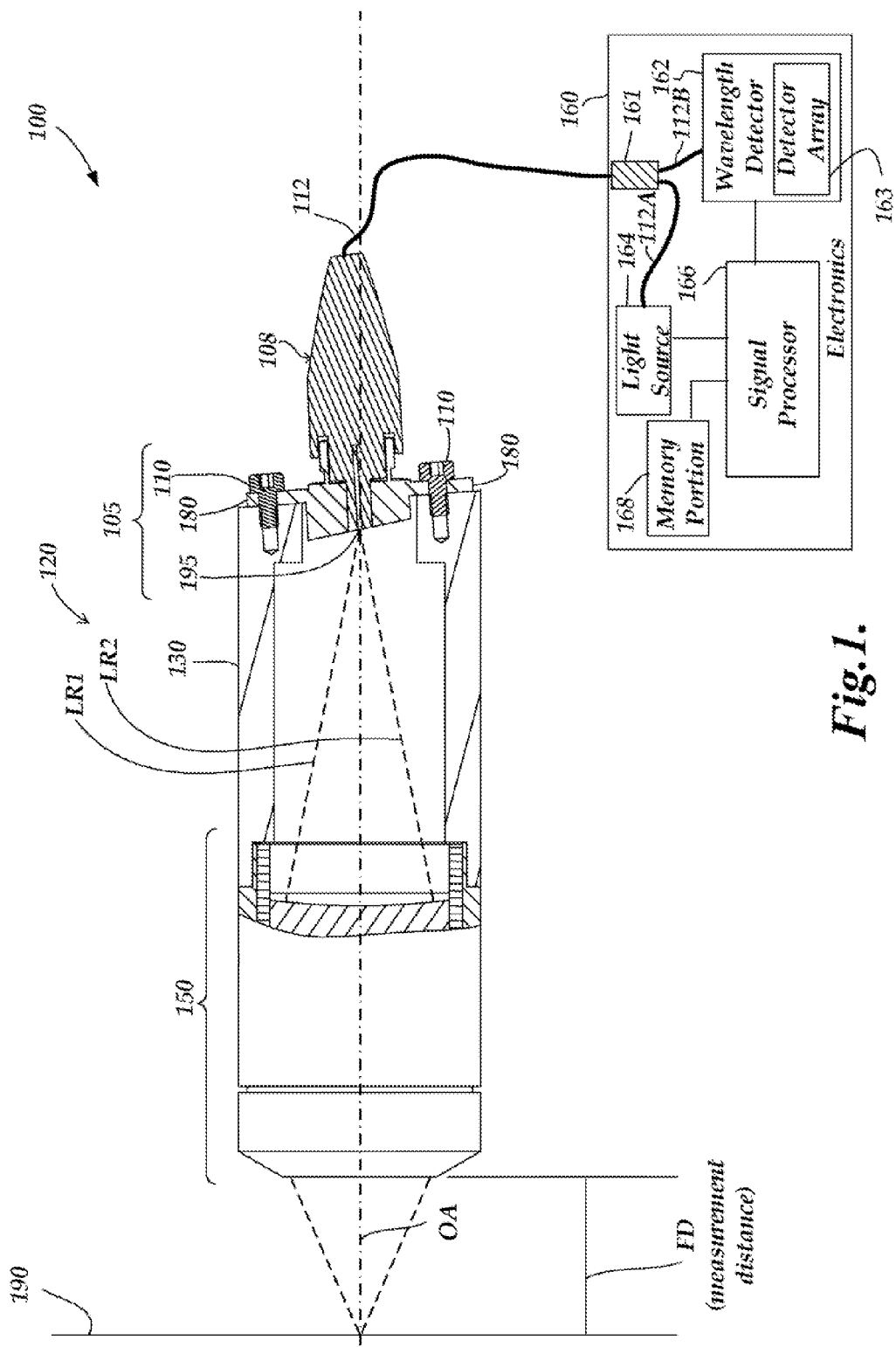
FIG. 1 is a block diagram of an exemplary chromatic point sensor including a light source configuration according to the invention.

FIG. 1 is a block diagram of an exemplary chromatic point sensor 100. As shown in FIG. 1, the chromatic point sensor 100 includes an optical pen 120 and an electronics portion 160. The optical pen 120 includes an in/out fiber optic sub-assembly 105, a housing 130, and an optics portion 150. The in/out fiber optic sub-assembly 105 includes a mounting element 180, that may be attached to the end of the housing 130 using mounting screws 110. The in/out fiber optic sub-assembly 105 receives an in/out optical fiber (not shown) through a fiber optic cable 112 which encases it, and through a fiber optic connector 108. The in/out optical fiber may be a multimode fiber (MMF) with a core diameter of about 50 microns. The in/out optical fiber outputs an output beam through an aperture 195, and receives reflected measurement signal light through the aperture 195.

In operation, light emitted from the fiber end through the aperture 195 is focused by the optics portion 150, which includes a lens that provides an axial chromatic dispersion such that the focal point along the optical axis OA is at different distances depending on the wavelength of the light, as is known for chromatic confocal sensor systems. The light is focused on a workpiece surface 190. Upon reflection from the workpiece surface 190, the reflected light is refocused by the optics portion 150 onto the aperture 195 as illustrated by the limiting rays LR1 and LR2. Due to the axial chromatic dispersion, only one wavelength will have the focus distance FD that matches the measurement distance from the optical pen 100 to the surface 190. The wavelength that is best focused at the surface 190 will also be the wavelength of the reflected light that is best focused at the aperture 195. The aperture 195 spatially filters the reflected light such that predominantly the best focused wavelength passes through the aperture 195 and into the core of the optical fiber cable 112. The optical fiber cable 112 routes the reflected signal light to a wavelength detector 162 that is utilized for determining the wavelength having the dominant intensity, which corresponds to the measurement distance to the workpiece surface 190.

The electronics portion 160 includes a fiber coupler 161, an optical fiber 112B between the fiber coupler 161 and the wavelength detector 162, an optical fiber 112A between the fiber coupler 161 and a light source 164, a signal processor 166 and a memory portion 168. The wavelength detector 162 includes a spectrometer arrangement wherein a dispersive element (e.g., a grating) receives the reflected light through the optical fiber cable 112, the optical coupler 161 and optical fiber 112B and transmits the resulting spectral intensity profile to a detector array 163.

The light source 164, which is controlled by the signal processor 166, is coupled to the optical fiber 112A and through the optical coupler 161 (e.g., a 2×1 optical coupler) to the fiber cable 112. As described above, the light travels through the optical pen 120 which produces longitudinal chromatic aberration so that its focal length changes with the wavelength of the light. The wavelength of light that is most efficiently transmitted back through the fiber is the wavelength that is in focus on the surface 190. The reflected wavelength-dependent light intensity then passes through the fiber coupler 161 again so that approximately 50% of the light is directed to the wavelength detector 162, which receives the spectral intensity profile distributed over an array of pixels along a measuring axis of the detector array 163, and operates to provide corresponding profile data. The measurement distance to the surface is determined via a distance calibration lookup table which is stored in the memory portion 168. The light source 164 may comprise a phosphor-based high intensity light source configuration disclosed herein, for example, one of the light source configurations shown in FIGS. 2-4. It should be appreciated that such light source configurations are particularly well-suited to economically coupling high intensity light into the end of an optical fiber in a small space, and also offer the possibility of fast strobing, as explained in greater detail below. Thus, such light source configurations are not only novel within themselves, they may also particularly enhance the economy and utility of host systems that convey a light source to a workpiece through an optical path that includes optical fibers, such as CPS systems, certain spectrometer systems, and the like.

Figure 2:
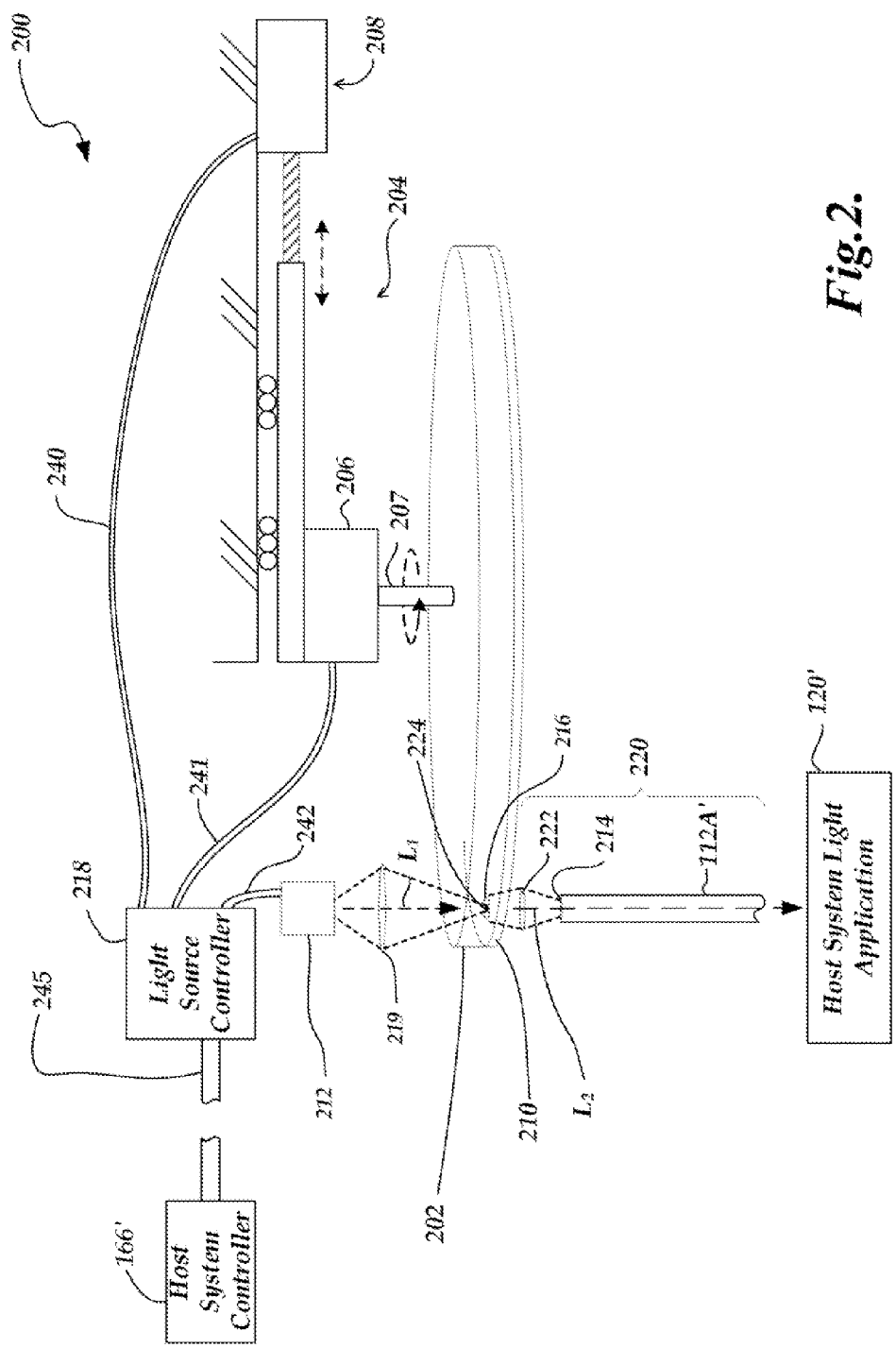
FIG. 2 is a diagram of a light source configuration according to a first embodiment of the invention.

FIG. 2 shows one exemplary light source configuration 200 used in (or with) a host system (e.g., a CPS system). Accordingly, the light source configuration 200 may be coupled to a host system controller 166' (e.g., a CPS controller/signal processor) through a signal line(s) 245 and optically coupled to a host system light application 120' (e.g., an optical pen) through an optical fiber 112A' (e.g., the optical fiber 112A and/or 112 shown in FIG. 1.)

The light source configuration 200 includes a movable member 202 mounted to a movable member actuator 204. In the illustrated embodiment, the movable member 202 takes the form of a rotatable disk, rotatable around an axis 207 that extends generally perpendicular to a plane of the movable member 202 in the illustrated embodiment. The movable member 202 is mounted to a rotary actuator 206 (e.g., a miniature precision rotary motor), which is in turn mounted to a linear actuator 208 (e.g., miniature precision linear motor or motor and lead screw). Thus, in the illustrated embodiment, the rotary actuator 206 and the linear actuator 208 together form the movable member actuator 204. In some embodiments, a rotatable disk may have a diameter on the order or 12, 25, or 50 millimeters, or the like, and may be rotated at up to 1, 5000, or 10,000 RPM, or even more. A light-emitting phosphor region (or composition) 210 (e.g., a layer, or coating, or the like) is associated with the movable member 202; for example, the light-emitting phosphor region 210 is located over or on a surface of the movable member 202, as illustrated.

The light-emitting phosphor region 210 may comprise a phosphor blend of a type suitable for producing broadband light (e.g., 400-700 nm, which may be useful in a CPS system application). For example, the phosphor blend may include a combination of a blue-emitting phosphor, a green-emitting phosphor and/or a red-emitting phosphor. Phosphor blends of a suitable type for producing broadband light are disclosed in U.S. Pat. Nos. 6,255,670; 6,765,237; 7,026,755; and 7,088,038, which are incorporated herein by reference. These patents describe phosphor blends in intimate or proximate contact with continuous-wave UV LED to output broadband light. Alternatively or additionally, phosphor blends of a suitable type for producing broadband light are disclosed in U.S. Pat. Nos. 6,066,861; 6,417,019; and 6,641,448, which are incorporated herein by reference. These patents describe YAG-Ce$^+$-based phosphor blends that absorb continuous blue LED light and output broadband light. Alternatively or additionally, phosphor blends of a suitable type for producing broadband light may include differently sized photoluminescent semiconductor nanoparticles such as disclosed in U.S. Pat. No. 7,279,832, or nanocrystalline materials such as disclosed in U.S. Pat. No. 7,235,792, or semiconductor nanocrystals such as disclosed in U.S. Pat. No. 7,083,490, each of which is hereby incorporated herein by reference in their entirety (later referred to as the '832 patent, the '792 patent and the '490 patent, respectively). Alternatively or additionally, phosphor blends of a suitable type for producing broadband light may include nanostructures based on zinc oxide nanorods such as disclosed in U.S. Patent Application Publication No. 20050255629 which discloses zinc oxide nanorods exhibiting photoluminescent properties and in U.S. Patent Application Publication No. 20050208302 which discloses zinc oxide nanorods as a nano-material for a nano-material/phosphor hetero-structure in a white light source (later referred to as the '629 publication and the '302 publication, respectively). The light source configuration 200 further includes an input light source 212 that provides or generates the input light $L_1$ which illuminates the light-emitting phosphor region 210 at an illuminated spot 224. The illuminated spot 224 is fixed relative to an emitted light output coupling region 216, to be described in detail below. The light source configuration 200 also includes a light source controller 218 operably connected to the linear actuator 208 through power and/or signal line(s) 240, the rotary actuator 206 through a power and/or signal line(s) 241 and the input light source 212 through power and/or signal line(s) 242.

In the illustrated embodiment, the movable member 202 is made of a material substantially transmissive to the input light $L_1$ such that the input light $L_1$ from the input light source 212 transmits through the movable member 202 and illuminates the illuminated spot 224 on the light-emitting phosphor region 210, which is located on the other side of the movable member 202 near to the optical fiber 112A' that receives its emitted light. In accordance with various exemplary embodiments, the input light source 212 may be a laser light source, such as a violet (e.g., wavelength of 405 nm) diode laser (e.g., 500 mW, 1 W), to provide high-intensity input light. In various embodiments, the input light source 212 may be configured to provide an average intensity of 2 milliwatts/mm$^2$ to 10,000 Watts/mm$^2$ or more at the illuminated spot 224, which may have a diameter on the order of 100 microns, or more specifically 150 microns in some particularly advantageous embodiments, in order to achieve a desired level of high-intensity broadband emission from a small region of the light-emitting phosphor region 210. The input light source 212 may also be formed using one or more light-emitting diodes (LEDs) or a plurality of laser diodes.

Further, advantageously, the input light source 212 supports high brightness-modulation rates, e.g., on the order of 1 KHz, or even more advantageously 30 kHz to 20 MHz, which may be equal to or greater than the host system's measurement rate. Specifically, brightness of the input light source 212 can be modulated electronically using pulse width modulation techniques (PWM) and/or amplitude modulation techniques. The light source controller 218 is configured to operate the input light source 212 with at least one pulse duration, which in some embodiments may be a pulse duration that is on the order of 50-200 ns (or 5-20 MHz). In one example, 8-bit brightness level variation can be achieved by operating the input light source based on time increments (e.g., pulses or clock cycles) that are 255 times shorter than the readout time (e.g., 50 µs, or 33 µs, etc.), that is, with a pulse or clock cycle duration of about 196 ns (50 µs/255) or 129 ns (33 µs/255), etc.

Optionally, in some embodiments, an input light path optical element set of the light source configuration 200 may include focusing optics 219, such as one or more lenses, arranged between the input light source 212 and the movable member 202 and phosphor region 210, to provide a desired size for the illumination spot 224. In some embodiments, the light source configuration 200 may also include an output light path optical element set 220 including, for example, an optional collection optics 222, such as one or more lenses, and an optical fiber 112A' including a fiber end 214. However, in some embodiments the output light path optical element set 220 may be omitted from the light source configuration and/or defined as part of the host system light application 120', or the like. In any case, the output light path optical element set 220, when provided, may provide an entrance aperture (e.g., an aperture defined by the collection optics 222 and/or the fiber end 214) located to receive the output light L2 from the emitted light output coupling region 216. In some embodiments, an emitted light output coupling region may be defined as the region that produces emitted light that is actually coupled into the end of an output optical fiber, (e.g., the output light L2 that is coupled into the fiber end 214). In various other embodiments where the emitted light is output to an undefined element that is included in a host system or the like, an emitted light output coupling region may be defined to be coextensive with an excited phosphor spot surrounding the illumination spot, as described further below.

In operation, the light source controller 218 operates the movable member actuator 204 to provide at least one speed, such as 2.5 m/s, 5 m/s, 7.5 m/s, 10 m/s, or even 50 m/s or more, in various embodiments and/or applications, of the light-emitting phosphor region 210 across the illuminated spot 224. In the illustrated embodiment wherein the movable member actuator 204 includes the rotary actuator 206 and the linear actuator 208, the rotary actuator 206 is configured and controlled to rotate the disk-shaped movable member 202 while the linear actuator 208 is configured and controlled to linearly displace the disk-shaped movable member 202 relative to the illuminated spot 224, for example, radially inwardly to provide a fresh track along the light-emitting phosphor region should one track of the phosphor region 210 become inoperative. Thus, in general, the illuminated spot 224 may traverse the light-emitting phosphor region 210 along a generally circular and/or spiral path, anywhere between a peripheral edge of the disk-shaped movable member 202 and its central point. In some embodiments, the linear actuator 208 may be omitted, and a single track used along the phosphor region 210. In any case, relative motion of the light-emitting phosphor region 210 relative to the illuminated spot 224 allows the phosphor region 210 to generate high intensity light in a sustained manner, to thereby support high intensity strobe cycles (e.g., with an exposure time on the order of 50 µs, or 33 µs, or less) over a long lifetime.

When illuminated by the input light L1, the light-emitting phosphor region 210 at the illuminated spot 224 emits output light. Specifically, the light-emitting phosphor region 210 may comprise any of the aforementioned phosphor materials which absorbs the input light L1 having a first wavelength (or wavelength range), and emits output light having a second wavelength range different from the first wavelength, which is generally longer than the first wavelength. The output light emitted from the light-emitting phosphor region 210 in the emitted light output coupling region 216 is further collected as output light L2 and input to the fiber end 214 to be delivered to the host system light application 120' (e.g., such as an optical pen, when the host system is a CPS system). The host system light application 120' may then use the delivered light to perform an optical operation, such as an illumination operation and/or a chromatic confocal sensing operation, or the like.

In some embodiments, the illuminated spot 224 may have a diameter on the order of 5-10 microns. The light-emitting phosphor region 210 may emit light from an excited phosphor spot that is larger than and surrounds the illuminated spot 224 (e.g., with an excited spot diameter of 150 microns). The fiber end may have a diameter on the order of 50-100 microns, in some embodiments. The distance from the illuminated spot 224 and/or the emitted light output coupling region 216 to the entrance aperture of the output light path optical element set 220 (e.g., the aperture defined by the collection optics 222 and/or the fiber end 214) may be set on the order of 150-300 microns.

The speed of the movable member actuator 204 or, more specifically, the speed at which the light-emitting phosphor region 210 traverses the illuminated spot 224, may be set so as to reduce optical quenching and minimize photobleaching or fading of the light-emitting phosphor region 210. Various related considerations are outlined below with reference to FIG. 5. Briefly, photobleaching is the photochemical destruction of a fluorophore in a phosphor material by the light exposure necessary to stimulate the fluorophore into fluorescing. Thus, photobleaching can be controlled by reducing the intensity or time-span of light exposure as well as the number of exposure cycles. Since a certain intensity of the input light is required to excite the phosphor region to emit high-intensity light, the intensity of the input light cannot be lowered beyond a desired operating level. Therefore, the time-span of light exposure and the number of exposure cycles (i.e., absorption-emission cycles) may be controlled to moving the phosphor region so as to reduce photobleaching. It is believed that photobleaching is correlated to the phosphor material's cumulative total exposure to light, i.e., (the exposure intensity)×(the time-span of light exposure)×(the number of exposure cycles). Reduction of photobleaching, in turn, results in a high-intensity light source configuration having a stable and long lifetime. Thus, depending on the characteristics of a particular light-emitting phosphor region 210, one can roughly calculate the life time of a light source configuration as: (the total area of a movable member with which the light-emitting phosphor region 210 is applied)/(the area of the illuminated spot 224)×(the time-span of light exposure)×(the number of exposure cycles). In various embodiments, a light-emitting phosphor region associated with the movable member is distributed over an area of several times a nominal area of the illuminated spot and/or the emitted light output coupling region. In some embodiments and/or applications, it may be advantageous to distribute a light emitting phosphor region over an area of at least 25 times, or 50 times, the area of the excited phosphor spot or track and/or the emitted light output coupling region, in order to extend the life of the light source configuration to a desirable level. In some embodiments suitable for more demanding applications, it may be advantageous to distribute the light emitting phosphor region over an area of at least 100 times, 200 times or even 500 or more times the area of the illuminated spot and/or the emitted light output coupling region, in order to extend the life of the light source configuration to a desirable level (e.g., life on the order of 10,000-50,000 hours, in some embodiments).

The time-span of input light exposure can be controlled by limiting the pulse duration used to operate the input light source 212, for example, to at most 50 μs, or 33 μs or less, if desired. In some embodiments, the time-span of input light exposure to a particular region of the phosphor region 210 may be further controlled (limited) by moving the light-emitting phosphor region 210 relative to the illuminated spot 224 at a certain speed. As the light-emitting phosphor region 210 moves, its portion initially within the illuminated spot 224 leaves the illuminated spot 224 so as to limit the time-span of light exposure to that portion.

The total number of exposure cycles of a particular region of the phosphor region 210 can also be controlled by moving the light-emitting phosphor region 210 relative to the illuminated spot 224. In some embodiments, the illuminated spot 224 may traverse the light-emitting phosphor region 210 along a spiral path, such that the entire area of the phosphor region 210 may be used and any particular portion of the light-emitting phosphor region 210 is exposed to the input light $L_1$ for a reasonable amount of time that will not cause its depletion. In some embodiments, the spiral path may be repeated for a controlled number of times that is predetermined. For example, the rotary actuator 206 may rotate the disk-shaped movable member 202 such that the illuminated spot 224 traverses the light-emitting phosphor region 210 along a circular track along the periphery of the movable disk 202 for a controlled number of times (cycles). Then, the linear actuator 208 may shift the movable member 202 such that the illuminated spot 224 is positioned radially inward to a new circular track along the movable member 202. Thereafter, the rotary actuator 206 may rotate the movable member 202 such that the illuminated spot 224 traverses the light-emitting phosphor region 210 along the new circular track for a controlled number of times (cycles). The process may be repeated, with each time, the illuminated spot 224 being positioned radially inward on the movable member 202.

It should be noted that the rotary actuator 206 may rotate the movable member 202 at a constant linear speed (e.g., 2.5 m/s-100 m/s), a constant angular speed (e.g., 400 rps-800 rps), a variable linear speed, or a variable speed. When a constant angular speed is used, the linear speed at which the illuminated spot 224 traverses the light-emitting phosphor region 210 may be changed depending on the radial position of the illuminated spot 224 relative to the disk-shaped movable member 202. The changing linear speed should be considered, when limiting the time-span of light exposure or the number of exposure cycles, so as to reduce photobleaching uniformly across the light-emitting phosphor region 210. For example, the number of rotations, and hence the number of exposure cycles, may be reduced for a circular path that is radially inward as compared to a circular path that is radially outward over the disk-shaped movable member 202, such that the cumulative total exposure time (the time-span of light exposure times the number of exposure cycles) is substantially the same across various portions of the light-emitting phosphor region 210.

Figure 3:
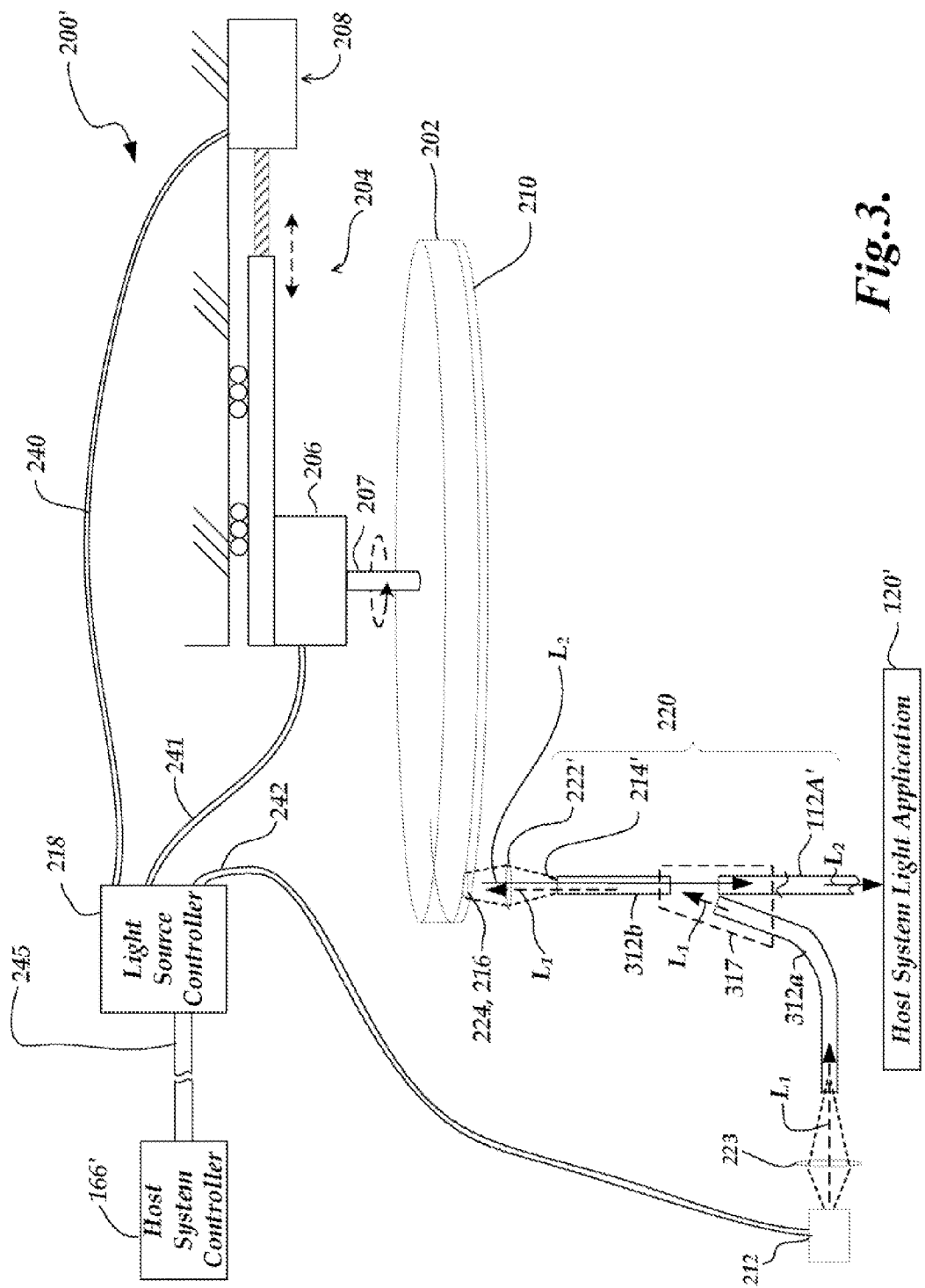
FIG. 3 is a diagram of a second embodiment of a light source configuration according to the invention.

FIG. 3 illustrates another embodiment of a phosphor-based high-intensity light source configuration 200'. In FIG. 3, the same or similar elements as those in FIG. 2 are noted with the same or similar reference numbers. The configuration 200' of FIG. 3 differs from the configuration 200 of FIG. 2, in that the input light source 212 is located on the same side the movable member 202, and the phosphor region 210, as the output light path optical element set 220. In various embodiments, it is advantageous if the movable member 202 includes a surface made of a material that is substantially reflective of the emitted light, such that the portion of light that is emitted toward surface is reflected, in order to contribute to the output light $L_2$.

In operation, the input light $L_1$ from the input light source 212 is received by an input path optical element set, which includes one or more lenses 223, optical fiber segments 312a and 312b, and an optional lens 222', in the particular embodiment illustrated in FIG. 3. The optical fiber segment 312a is coupled to the optical fiber segment 312b at a fiber coupling 317 such that the two fiber segments together form an input optical fiber. The input light $L_1$ from the input light source 212 travels through the input light path optical element set, exits therefrom via an exit aperture provided by the fiber end 214' and/or the optional lens 222', to illuminate the light-emitting phosphor region 210 at the illuminated spot 224. As previously outlined, the movable element 202, or a surface included therein or thereon, may be made of a material substantially reflective of the input light $L_1$ and also the light emitted from the light-emitting phosphor region 210, in order to maximize the contribution of the light emitted from the light-emitting phosphor region 210 (and potentially some reflected portion of the input light L1) to the output light $L_2$.

In the embodiment shown in FIG. 3, the illuminated spot 224 may approximately coincide with an emitted light output coupling region 216. In some embodiments, an emitted light output coupling region may be defined as the region that produces emitted light that is actually coupled into the end of an output optical fiber, (e.g., the output light L2 that is coupled into the fiber end 214'). In various other embodiments where the emitted light is output to an undefined element that is included in a host system or the like, an emitted light output coupling region may be defined to be coextensive with an excited phosphor spot surrounding the illumination spot. In some embodiments, an excited phosphor spot and an associated excited phosphor track, which the excited phosphor spot moves along as the movable element 202 moves, may be somewhat larger (wider) than, or even significantly larger than, the illuminated spot 224, as described in greater detail below. In the embodiment shown in FIG. 3, the output light $L_2$ enters an entrance aperture of an output light path optical element set, which includes the optional lens 222', optical fiber segment 312b, and the optical fiber 112A', in the particular embodiment illustrated in FIG. 3. The optical fiber segment 312b is coupled to the optical fiber 112A' at the fiber coupling 317 such that the two fiber segments together form an output optical fiber. The output light $L_2$ through the output light path optical element set, is to be input to the host system light application 120', as previously outlined with reference to FIG. 2. The light source configuration 200' may be moved and/or controlled approximately as previously outlined with reference to the light source configuration 200 shown in FIG. 2.

It will be appreciated that the embodiment of FIG. 3 may be advantageous in that it does not require aligning the exit aperture of the input light path optical element set 223 with the entrance aperture of the output light path optical element set and/or the illuminated spot 224 and/or the excited phosphor spot, since the input and output apertures may be provided by a single aperture.

Figure 4:
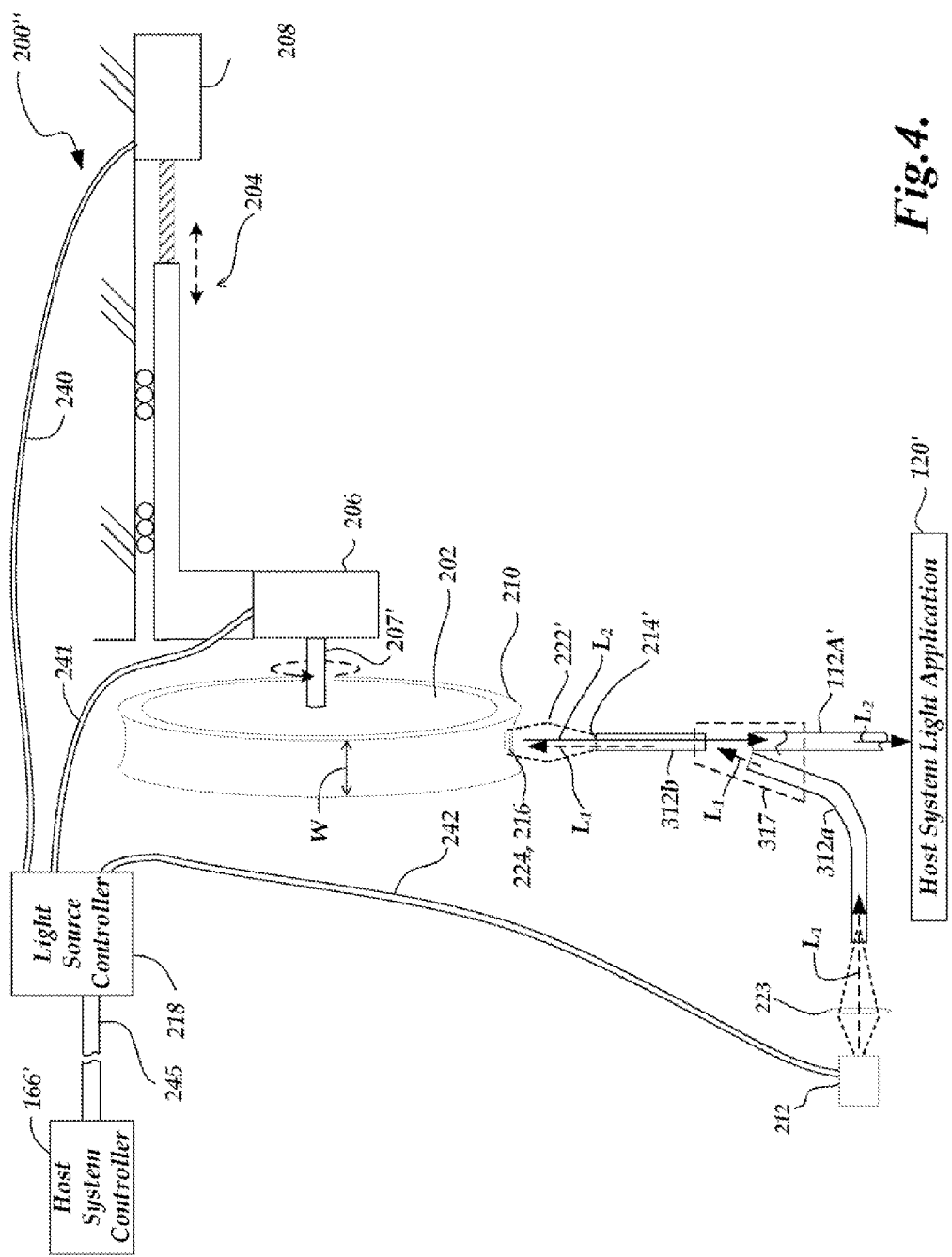
FIG. 4 is a diagram a third embodiment of a light source configuration according to the invention.

FIG. 4 illustrates yet another embodiment of a phosphor-based, high-intensity light source configuration 200". In FIG. 4, the same or similar elements as those in FIGS. 2 and 3 are noted with the same or similar reference numbers. The configuration 200" of FIG. 4 differs from the configuration 200' of FIG. 3, in that the movable member 202 is arranged to rotate around an axis 207' that extends generally perpendicular to the optical axis of the light source configuration 200", which is aligned with the output light $L_2$ in the illustrated embodiment. In this embodiment, the light-emitting phosphor region 210 is provided on and along the "edge" of the generally disk-shaped movable member 202, the edge having a width "W".

The input and output light paths may be understood by analogy with the previous description of the operation of similar elements in the embodiment of FIG. 3, and need not be described further here. As with the embodiment of FIG. 3, the movable element 202, or a surface included therein or thereon, is preferably made of a material substantially reflective of the input light $L_1$ and the output light $L_2$, for previously described reasons.

The embodiment shown in FIG. 4 may be advantageous in that a large area of light emitting phosphor region may be provided on edge of the movable element 202, and the entire area may be positioned at the illuminated spot with only a relatively small motion along the direction of the width W. Thus, the motion control system may be simplified and made more compact and economical, in comparison to that described with reference to FIG. 2 and/or FIG. 3. In operation, the light source controller 218 operates the movable member rotary actuator 206 to provide at least one surface speed of the light-emitting phosphor region 210 across the illuminated spot 224, such as 2.5 m/s, 5 m/s, 7.5 m/s, 10 m/s, or even 50 m/s or more, in various embodiments and/or applications. In the illustrated embodiment wherein the movable member actuator 204 includes the linear actuator 208, the linear actuator 208 is configured and controlled to linearly displace the disk-shaped movable member 202 relative to the illuminated spot 224 along the direction of the width W. Thus, in general, the illuminated spot 224 may traverse the light-emitting phosphor region 210 along a generally circular and/or helical path, anywhere between the edge of the disk-shaped movable member 202. In some embodiments, the linear actuator 208 may be omitted, and a single track used along the phosphor region 210. In any case, relative motion of the light-emitting phosphor region 210 relative to the illuminated spot 224 allows the phosphor region 210 to generate high intensity light in a sustained manner, to thereby support high intensity strobe cycles (e.g., with an exposure time on the order of 50 µs, or 33 µs, or less) over a long lifetime, while avoiding undesirable optical quenching and photobleaching.

In some embodiments, the illuminated spot 224 may traverse the light-emitting phosphor region 210 along a generally helical path, such that any portion of the light-emitting phosphor region 210 is exposed to the input light only once. In other embodiments, the generally helical path may be traversed for a controlled number of times (cycles). In still other embodiments, the rotary actuator 206 may rotate the disk-shaped movable member 202 such that the illuminated spot 224 traverses the light-emitting phosphor region 210 along a circular path near one extreme of the width W for a controlled number of times (cycles). Then, the linear actuator 208 may shift the movable member 202 such that the illuminated spot 224 is displaced along the width W. Thereafter, the rotary actuator 206 may rotate the movable member 202 such that the illuminated spot 224 traverses the light emitting phosphor region 210 along a new circular path offset (along the width W) from the previous circular path for a controlled number of times. The process may be repeated, until the resulting circular paths have covered the entire width W over the life of the light source, if desired.

Figure 5:
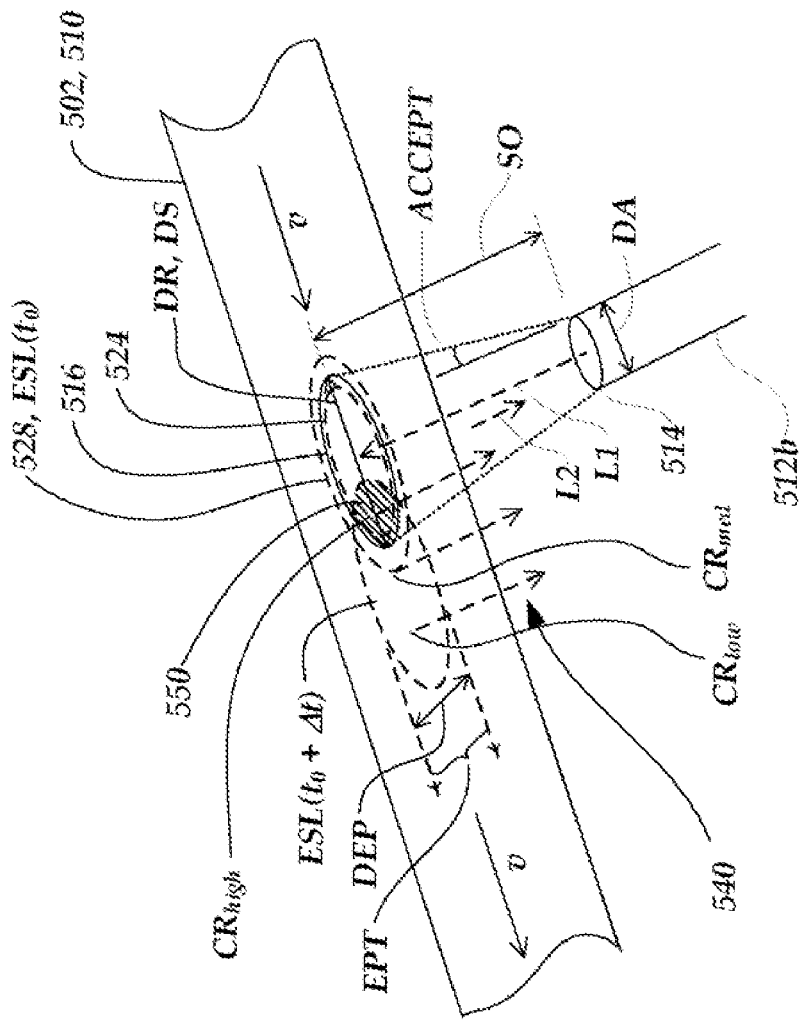
FIG. 5 is a diagram illustrating various considerations related to operating a light source configuration according to the invention.

FIG. 5 illustrates some considerations related to operating a light source configuration in some embodiments. Briefly, FIG. 5 shows a moving substrate portion 502 of the movable member, which includes a light-emitting phosphor region 510, and an optical fiber 512b having a fiber end 514. As shown in FIG. 5, the fiber end 514 has an effective aperture diameter of DA. For clarity, only light rays within a small range of angles approximately normal to the moving substrate portion 502 are illustrated and described below. It should be understood by those skilled in the art that additional light rays may be operable in a light source configuration disclosed herein. However, the basic operating and design considerations of light source configuration disclosed herein may be understood by consideration of the illustrated and described light rays.

In operation, the fiber end 514 provides an exit aperture for the input light L1, which has transmitted through the optical fiber 512b from a light source such as a laser diode, LED, or the like (not shown). The input light L1 reaches the light-emitting phosphor region 510 at an illuminated spot 524 that is centrally located in an emitted light output coupling region 516, at a time t0. In the embodiment shown in FIG. 5, the characteristics of the optical fiber 512b (e.g., the aperture diameter of DA and the acceptance angle ACCEPT), in combination with the standoff spacing SO between the fiber end 514 and the light emitting phosphor region 510, determines the size of the illuminated spot 524 and the emitted light output coupling region 516. In the illustrated embodiment, the emitted light output coupling region 516 is the region that produces emitted light that is actually coupled into the fiber end 514 (e.g., the output light L2). The diameter DS of the illuminated spot 524 and the diameter DR of the emitted light output coupling region 516 may be approximately the same in this particular embodiment (e.g., on the order of [DA+ 2*SO*tan(ACCEPT)]). Also shown in FIG. 5 is an excited phosphor spot 528 and an associated excited phosphor track EPT, which the excited phosphor spot 528 moves along. The phosphor region 510 may exhibit an excited phosphor diameter DEP that is larger than the diameter DS of the illuminated spot 524, however, for the purpose of explaining various design and operating considerations with greater simplicity and clarity, it is assumed here that excited phosphor diameter DEP is not much larger than the diameter DR of the emitted light output coupling region 516. It is also assumed that the phosphor region 510 is illuminated and "instantaneously" begins emitting the output light 540 from an emitting surface location ESL(t0) at the time t0. It will be appreciated that these assumptions are for convenience only, and various embodiments of the invention are not limited to these assumptions. According to these assumptions, FIG. 5 shows the emitting surface location ESL(t0) that coincides with the excited phosphor spot 528 that is centered on the illuminated spot 524 at the time t0, and the corresponding displaced emitting surface location ESL(t0+Δt) of that particular excited phosphor spot 528 after a time Δt has passed as it travels along the excited phosphor track EPT. It will be understood that if the moving substrate portion 502 moves at a speed v as shown, then the displaced emitting surface location ESL(t0+Δt) will be at a displacement d(Δt)=(v*Δt) relative to the initial emitting surface location ESL(t0).

For purposes of explanation, FIG. 5 shows that the particular excited phosphor spot 528, which is at an emitting surface location ESL(t) at a generic time t, includes three representative light contribution regions: CRlow, CRmed, and CRhigh. It will be appreciated that all the light contribution regions, CRlow, CRmed, and CRhigh, will provide output light 540 that may enter the fiber end 514 at the time t0. Thereafter, assuming that the phosphor region 510 emits light over an emission time longer than Δt, the light contribution region CRlow will be the first region to reach a displacement away from the fiber end 514 along the direction of motion of the moving substrate portion 502 such that it falls outside the emitted light output coupling region 516 and stops contributing significantly to the output light L2 that enters the fiber end 514. Some time later, the light contribution region CRmed will reach a similar displacement away from the fiber end 514 and outside the emitted light output coupling region 516 along the direction of motion of the moving substrate portion 502, such that it also then stops contributing significantly to the output light L2 that enters the fiber end 514. Finally, the light contribution region CRhigh will finish traversing the fiber end 514 and the emitted light output coupling region 516 (some time after the time interval Δt, which is illustrated in FIG. 5) and also reach a displacement such that it stops contributing significantly to the output light L2 that enters the fiber end 514.

Using the simple model outlined above, the output light L2 that enters the fiber end 514, at any time t after t0, is roughly proportional to the crosshatched area 550, which is the overlapping area between the emitting surface location ESL(t) and the emitted light output coupling region 516. Assuming that DEP is not much different than DR, and that the phosphor region 510 emits light over an emission time that is longer than (DR/v) and/or (DEP/v), the integral of the crosshatched area 550 over time is approximately proportional to the light energy input from the phosphor region 510 into the fiber end 514 over time.

However, there are multiple operating considerations related to maximizing the rate of light energy input from the phosphor region 510 into the fiber end 514. According to one consideration, it is desirable for the phosphor region 510 to emit light over an emission time that is shorter than (DR/v), such that all or most of the output light 540 is emitted within the emitted light output coupling region 516 proximate to the fiber end 514 (e.g., before the emitting surface location ESL(t) is displaced away from the emitted light output coupling region 516). However, according to a further consideration, the desired rate of light source energy input into the fiber end 514 should be very high and may be sustained by a light source configuration for a time significantly longer than a typical emission time for a phosphor region (e.g., longer than a typical emission time on the order of 400 ns, for example.) Furthermore, a phosphor region may become "fatigued" or quenched and require some recovery time before it can again be illuminated to emit light with its original efficiency. For example, additional illumination during its initial emission time may be quite inefficient. Therefore, for a sustained and high rate of light source energy input from the phosphor region 510 to the fiber end 514, according to this consideration, it is desirable to displace an emitting surface location ESL(t) (e.g., the excited phosphor spot 528) away from the fiber end 514 (e.g., in a time very roughly on the order of the emission time of the phosphor region), so that a fresh portion of the phosphor region 510 may be positioned in the illuminated spot 524 and illuminated to provide a fresh and efficient source of emitted light for input to the fiber end 514.

It will be appreciated that to some extent the desired conditions outlined above are contradictory, and must be balanced against one another. In practice, after a displacement of the emitting surface location ESL(t) by approximately DEP/2 and/or DR/2, the overlapping area 550 begins to diminish at an increasing rate. Therefore, given a phosphor region emission time (i.e., a decay time) of approximately TE (typically 50-400 ns), it may be desirable in some embodiments to move the phosphor region at a rate on the order of approximately DEP/TE to DEP/(2*TE), or DR/TE to DR/(2*TE), or the like. In such a case, most of the emitted light available from the emitting surface location ESL(t) may be input to the fiber end 514, while at the same time, a fresh portion of the phosphor region 510 may be positioned to fill much of the illuminated spot 524. In some embodiments, the illuminated spot 524 may be illuminated continuously. However, in other embodiments it may be advantageous to illuminate the illuminated spot 524 with a short pulse of light (e.g., using pulse length significantly less than TE, such as one half TE, or even less) at an illumination cycle time interval on the order of TE, in order to maintain a high and sustained rate of emitted light input into the fiber end 514 while also using the laser diode power efficiently. Of course, slower or faster motion speeds may be used with appropriate illumination rates (e.g., appropriate illumination strobe rates, or continuous illumination) for better energy efficiency, or to achieve higher emitted light energy input rates, respectively, in some embodiments. Thus, the foregoing operating condition suggestions are exemplary only, and not limiting. In any case, it should be appreciated that the light source configuration shown in FIG. 5 is particularly well-suited to economically coupling high intensity light, at relatively high power levels, into the end of an optical fiber in a small space. One important feature in this regard is that the light emitting phosphor region is moved such that it is refreshed at a high rate in the illuminated spot 524, to avoid the quenching of emitted light that would otherwise occur with a phosphor region at such high operating intensities and power levels in such a small region. Another important feature, and some embodiments, is that light energy is highly concentrated in both the small illuminated spot 524 and the small excited phosphor spot 528, which are furthermore positioned proximate to the fiber end 514 such that the fiber end 514 receives a relatively large proportion of the light from the excited phosphor spot 528 in a small space (e.g., along a very short optical path), with simple (or no) optical elements.

Figure 6:
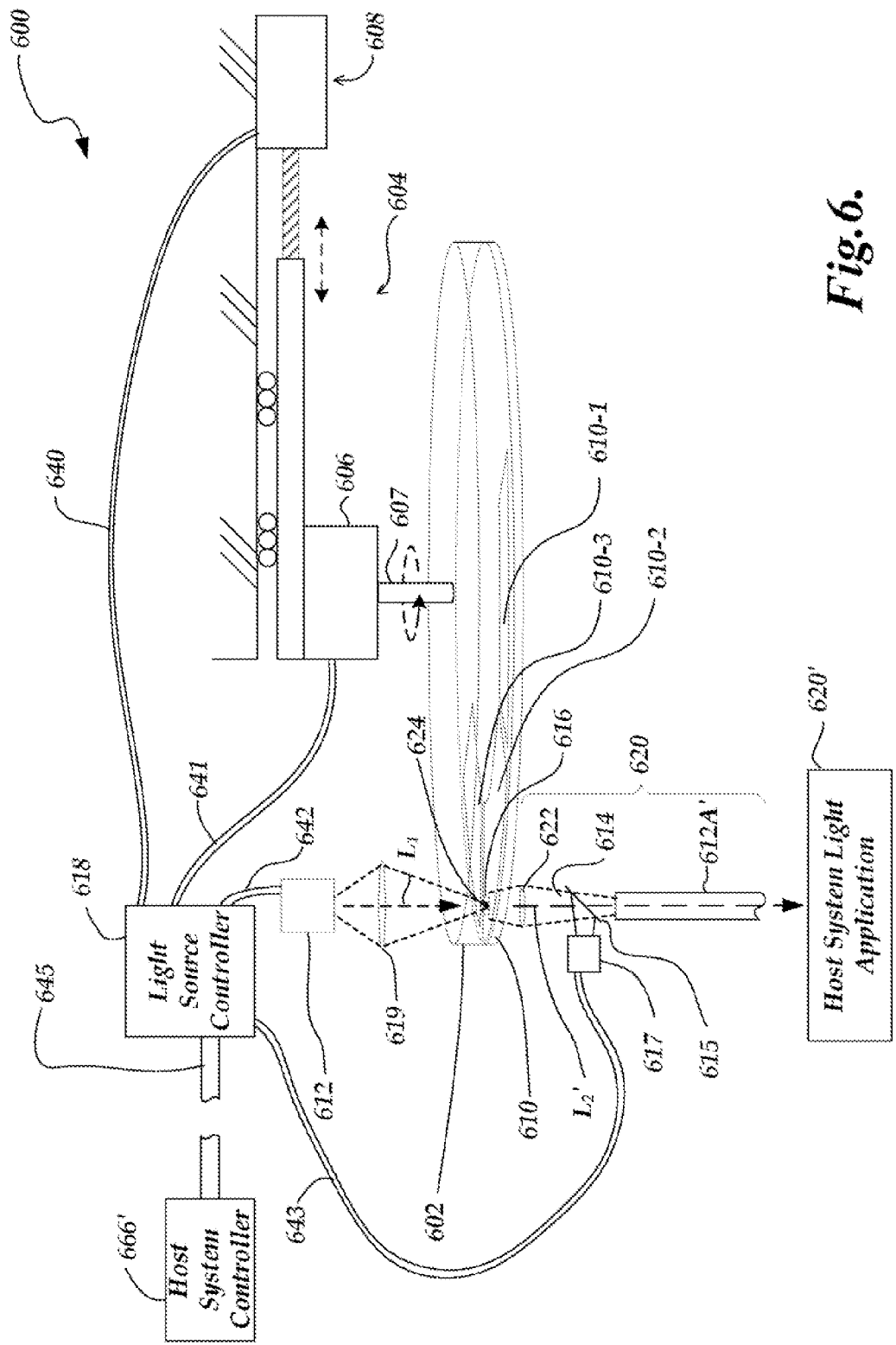
FIG. 6 is a diagram a fourth embodiment of a light source configuration according to the invention.

FIG. 6 is a diagram of a light source configuration 600. The 6XX series numbers in FIG. 6 that have the same "XX" suffix as 2XX, 3XX and/or 5XX series numbers in FIGS. 1-5 may designate similar or identical elements unless otherwise indicated. Thus, the operation of the light source configuration 600 may generally be understood by analogy with the description of previous figures, and only certain aspects of operation will be described here. In particular FIG. 6 shows a power sensing arrangement and a movable member 602 including phosphor sub-regions which differ from previously described embodiments. Similarly to previous embodiments, the movable member 602 may take the form of a disk, rotatable around an axis 607 that extends generally perpendicular to the plane of the movable member 602. However, in the embodiment illustrated in FIG. 6, the light-emitting phosphor region 610 includes a plurality of light-emitting phosphor sub-regions 610-X, which may have different phosphor compositions that each emit "restricted band" output light $L_2'$ having a unique peak wavelength, when illuminated by input light $L_1$ from an input light source 612. The phosphor sub-regions 610-X may be arranged in a desired pattern such as segments of rings (e.g. as indicated by the representative sub-regions 610-1, 610-2, and 610-3 shown in FIG. 6), or concentric rings, around the movable member 602, as described in further detail below with reference to FIG. 7 and FIG. 8.

The light source configuration 600 further includes a power sensing arrangement comprising a beamsplitter 615 and a power sensor 617. In operation, the beamsplitter 615 reflects a portion of the output light $L_2'$ to power sensor 617, which may be connected to the light source controller 618 by signal line(s) 643. The light source controller 618 may be configured to monitor the power of the output light $L_2'$ based on signals from the power sensor 617 and adjust power to the input light source 612, thereby controlling the power of the input light $L_1$ and the output light $L_2'$ in a closed loop manner (e.g., to provide output light at a desired power level, despite potential variations in input power, and/or optical path variations such as wobble of the movable member 602, or the like). In one application, the light source configuration 600 adjusts the power of the input light $L_1$ and the output light $L2'$ for purposes of automatic gain adjustment in a host system such as the chromatic point sensor 100 shown in FIG. 1, which may include providing normalized and/or calibrated light levels and/or signals in the chromatic point sensor 100. More generally, such closed loop control may be particular advantageous when phosphor sub-regions (e.g., the sub-regions 610-1, 610-2, and 610-3) comprise different phosphor compositions or blends, which may have different optical power conversion efficiencies. Such closed loop control allows the input power to be adjusted to provide the same output light power from each sub-region, or in a particular ratio between sub-regions, or the like.

In operation, the sub-regions of the light-emitting phosphor region 610 may be illuminated using methods described with reference to FIG. 2 and/or FIG. 5. However, in the illustrated embodiment, since each respective light-emitting phosphor sub-regions 610-X has a different respective peak wavelength, and only one of the plurality of different light-emitting phosphor regions 610-X is illuminated and overlaps with a light output coupling region 616 at a given instant, the timing and duration of the input light L1 may be controlled to determine the particular wavelength(s) that are output by the light source configuration 600. Various methods of controlling the timing and duration of the input light L1 are described in greater detail below with reference to FIGS. 7A and 7B.

Figure 7A:
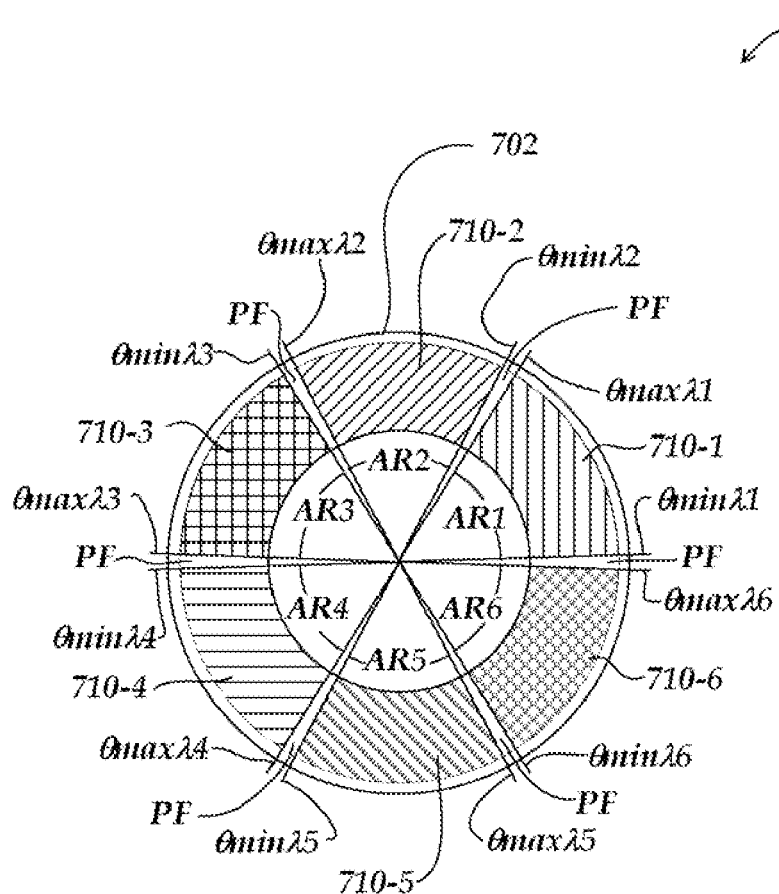
FIGS. 7A and 7B are related diagrams illustrating a first multi-wavelength phosphor region configuration included on a movable member in a light source configuration according to the invention, from two different perspectives.
Figure 7B:
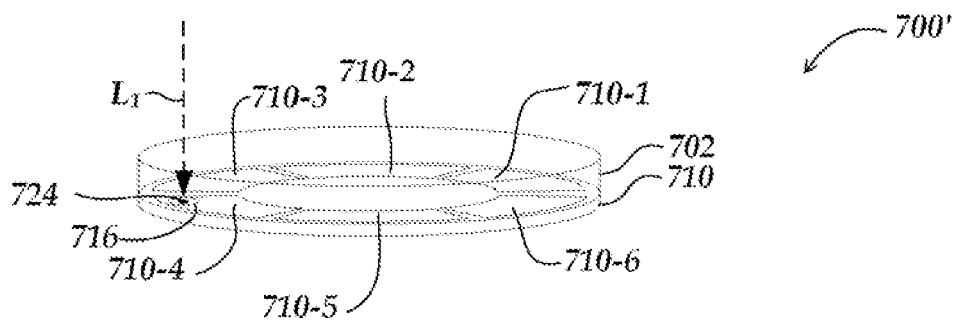

FIG. 7A is a diagram 700 of a first multi-wavelength phosphor region configuration 710 that may be included on a movable member 702 in a light source configuration. FIG. 7B is a diagram 700' showing a perspective side view of the first multi-wavelength phosphor region configuration 710 on the movable member 702. The 7XX series numbers in FIG. 7 that have the same "XX" suffix as 6XX series numbers in FIG. 6 may designate similar or identical elements unless otherwise indicated. Thus, the operation of the multi-wavelength phosphor region configuration 710 may generally be understood by analogy with the description of previous figures, and only certain aspects of its configuration and operation will be described here. The movable member 702 including the multi-wavelength phosphor region configuration 710 may be substituted for previously described movable members (the movable members shown in FIG. 2, 3 or 6, for example.)

The multi-wavelength phosphor region configuration 710 comprises light-emitting phosphor sub-regions (or compositions) 710-1, 710-2, 710-3, 710-4, 710-5 and 710-6 arranged as segments of a ring around the movable member 702. In one embodiment, each of the sub-regions 710-X (e.g., the sub-regions 710-1, 710-2, and so on) are configured to produce restricted band output light having a unique peak wavelength $\lambda X$ (e.g. $\lambda 1$, $\lambda 2$, and so on) when illuminated by input light. However, in another embodiment, at least one of the sub-regions 710-X may comprise a phosphor blend or composition that emits broadband output light. As shown in FIG. 7A, the light-emitting phosphor sub-regions 710-1, 710-2, 710-3, 710-4, 710-5 and 710-6 span angular ranges AR1=($\theta max\lambda 1 - \theta min\lambda 1$), AR2=($\theta max\lambda 2 - \theta min\lambda 2$), AR3=($\theta max\lambda 3 - \theta min\lambda 3$), AR4=($\theta max\lambda 4 - \theta min\lambda 4$), AR5=($\theta max\lambda 5 - \theta min\lambda 5$), and AR6=($\theta max\lambda 6 - \theta min\lambda 6$), respectively. In the particular embodiment shown in FIGS. 7A and 7B, sub-regions 710-X are separated by phosphor-free portions PF. However, in other embodiments the phosphor sub-regions 710-X may abut one another.

It should be appreciated that various wavelengths or combinations of wavelengths may be output from the multi-wavelength phosphor region configuration 710, depending on the control and synchronization of power in the illuminated spot 724 in relation to the position of the movable member 702. According to a first method of control and synchronization that provides output light from a single one of the sub-regions 710-X (e.g., restricted or "single band" output light having a unique peak wavelength $\lambda X$), the input light source is controlled to provide power in the illuminated spot 724 only when the illuminated spot 724 coincides with a position inside the corresponding angular range ARX of the sub-region 710-X as the movable member is rotated. In one method of control, the light source is controlled such that the single band light is output during a single revolution of the movable member, in order to satisfy the illumination power requirements associated with a single sampling or imaging period of a host system. In another method of control, the light source is controlled to provide repetitively pulsed power to the illuminated spot 724, such that single band light is output during each of a plurality of revolutions of the movable member, and the power provided during the plurality of revolutions is integrated in order to satisfy the illumination power requirements associated with a single sampling or imaging period of a host system. In another method of control, a plurality of different single band spectrums may be provided sequentially in the output light, by repeating the operations outlined above corresponding to each of a plurality of different sub-regions 710-X. It will be appreciated that if the output light provided by the plurality of different single band spectrums is integrated in order to satisfy the illumination power requirements associated with a single sampling or imaging period of a host system, then the output light spectrum effectively comprises a combination of the different single band spectra for that sampling or imaging period.

In various embodiments, if the multi-wavelength phosphor region configuration 710 is used with a light source that includes the capability to rotate movable member 702 with an angular velocity ω (e.g., as a single available angular velocity, or as one of a range of controllable angular velocities), then single band light may be provided from any respective sub-regions 710-X by providing the capability of pulsing the input light L1 for a pulse duration TX that is less than ARX/ω, and synchronizing the input light L1 such that the illuminated spot 724 falls within that sub-region 710-X.

In one embodiment, the unique peak wavelengths λ1, λ2, λ3, λ4, λ5, and λ6 may have values of approximately 448 nm, 492 nm, 558 nm, 571 nm, 620 nm and 652 nm, respectively. The full width half maximum bandwidth of their spectrums may be approximately 53 nm, 97 nm, 104 nm, 74 nm and 85 nm, respectively. Exemplary phosphor materials which may produce these values may include those disclosed previously, and/or as taught in the incorporated references. Various other exemplary phosphor materials are available from commercial sources such as Phosphortech Inc. of Lithia Springs, Ga. USA, and may include conventional phosphor materials or nanocrystalline phosphor materials or quantum dots, and the like. Exemplary compositions for conventional phosphor materials are disclosed in U.S. Pat. No. 7,112,921, issued to Menkara et al. and assigned to Phosphortech Inc, which is hereby incorporated herein by reference in its entirety.

Figure 8A:
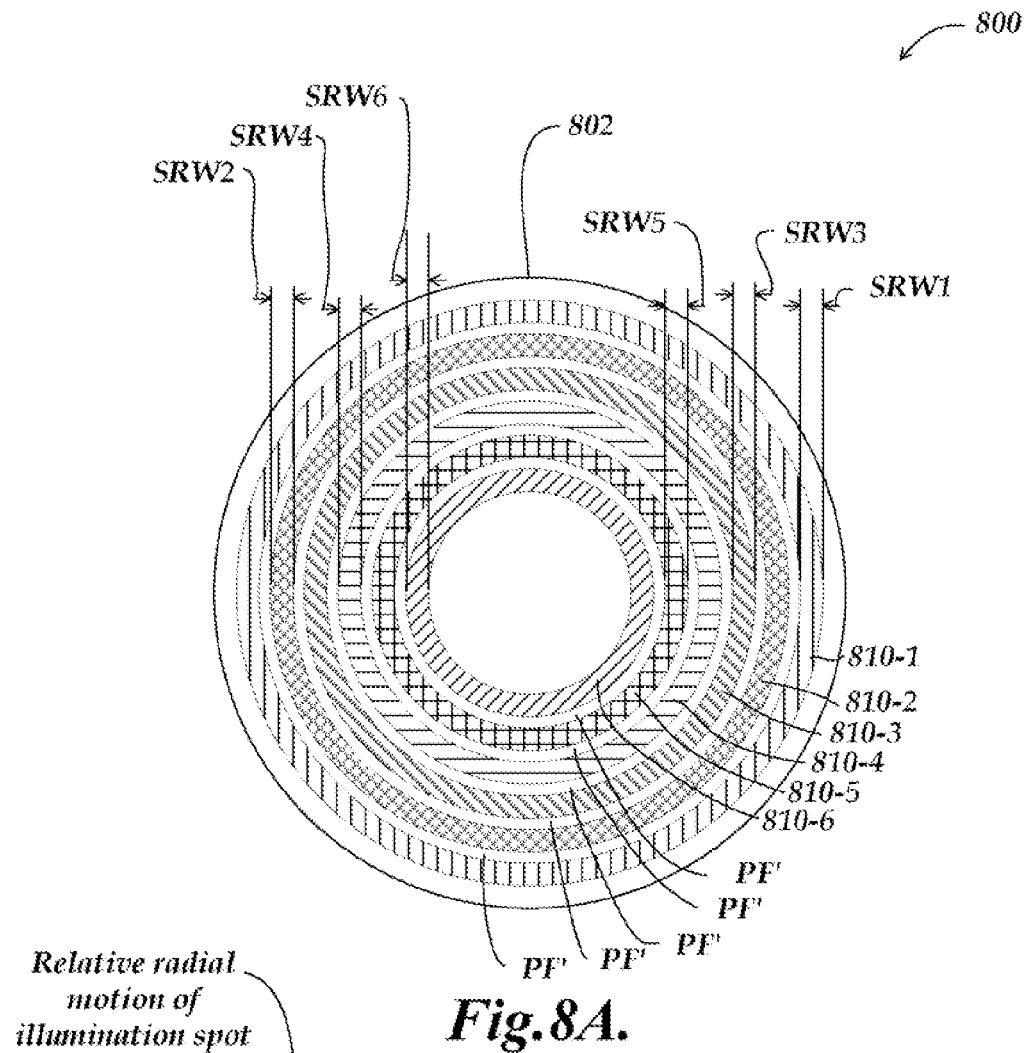
FIGS. 8A and 8B are related diagrams illustrating a second multi-wavelength phosphor region configuration included on a movable member in a light source configuration according to the invention, from two different perspectives.
Figure 8B:
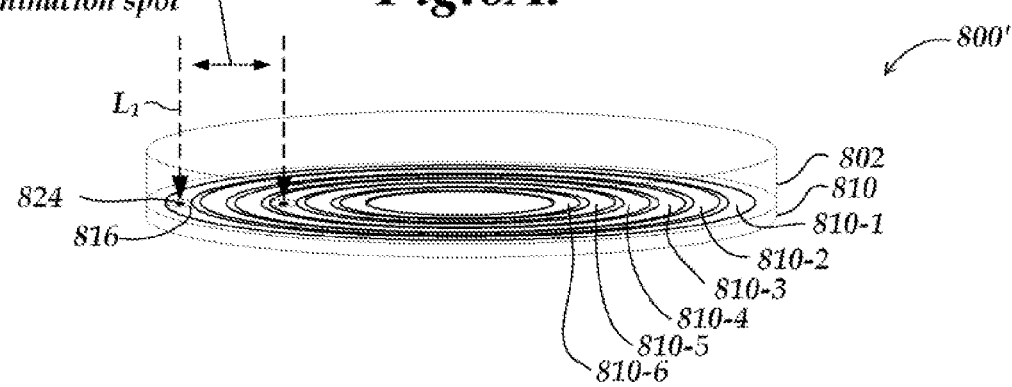

FIG. 8A is a diagram 800 of a second multi-wavelength phosphor region configuration 810 that may be included on a movable member 802 in a light source configuration. FIG. 8B is a diagram 800' showing a perspective side view 800' of the second multi-wavelength phosphor region configuration 810 included on the movable member 802. The 8XX series numbers in FIG. 8 that have the same "XX" suffix as 6XX series numbers in FIG. 6 may designate similar or identical elements unless otherwise indicated. Thus, the operation of the multi-wavelength phosphor region configuration 810 may generally be understood by analogy with the description of previous figures, and only certain aspects of operation will be described here. The movable member 802 including the multi-wavelength phosphor region configuration 810 may be substituted for previously described movable members (the movable members shown in FIG. 2, 3 or 6, for example.)

In contrast to the pattern of ring segments used for the sub-regions 710-X outlined above with reference to FIGS. 7A and 7B, the multi-wavelength phosphor region configuration 810 comprises phosphor sub-regions (or compositions) 810-1, 810-2, 810-3, 810-4, 810-5 and 810-6 arranged as concentric rings or tracks on the movable member 802. In one embodiment, each of the sub-regions 810-X (e.g., the sub-regions 810-1, 810-2, and so on) are configured to produce restricted band output light having a unique peak wavelength λX (e.g., λ1, λ2, and so on) when illuminated by input light. However, in another embodiment, at least one of the sub-regions 810-X may comprise a phosphor blend or composition that emits broadband output light. As shown in FIG. 8A, the light-emitting phosphor sub-regions 810-1, 810-2, 810-3, 810-4, 810-5 and 810-6 span sub-region ring or track widths SRW1, SRW2, SRW3, SRW4, SRW5, and SRW6, respectively. In the particular embodiment shown in FIGS. 8A and 8B, sub-regions 810-X are separated by phosphor-free portions PF. However, in other embodiments the phosphor sub-regions 810-X may abut one another. Furthermore, although the various sub-regions 810-X are illustrated with approximately equal widths SRWX, in other embodiments the sub-regions 810-X may be configured with widths that provide approximately equal areas, or other desired pattern relationships. In one embodiment, an "equal area" configuration may be used with appropriately controlled illumination spot locations or tracks to provide similar photo-bleaching lifetimes in the various sub-regions, for example.

Figure 9:
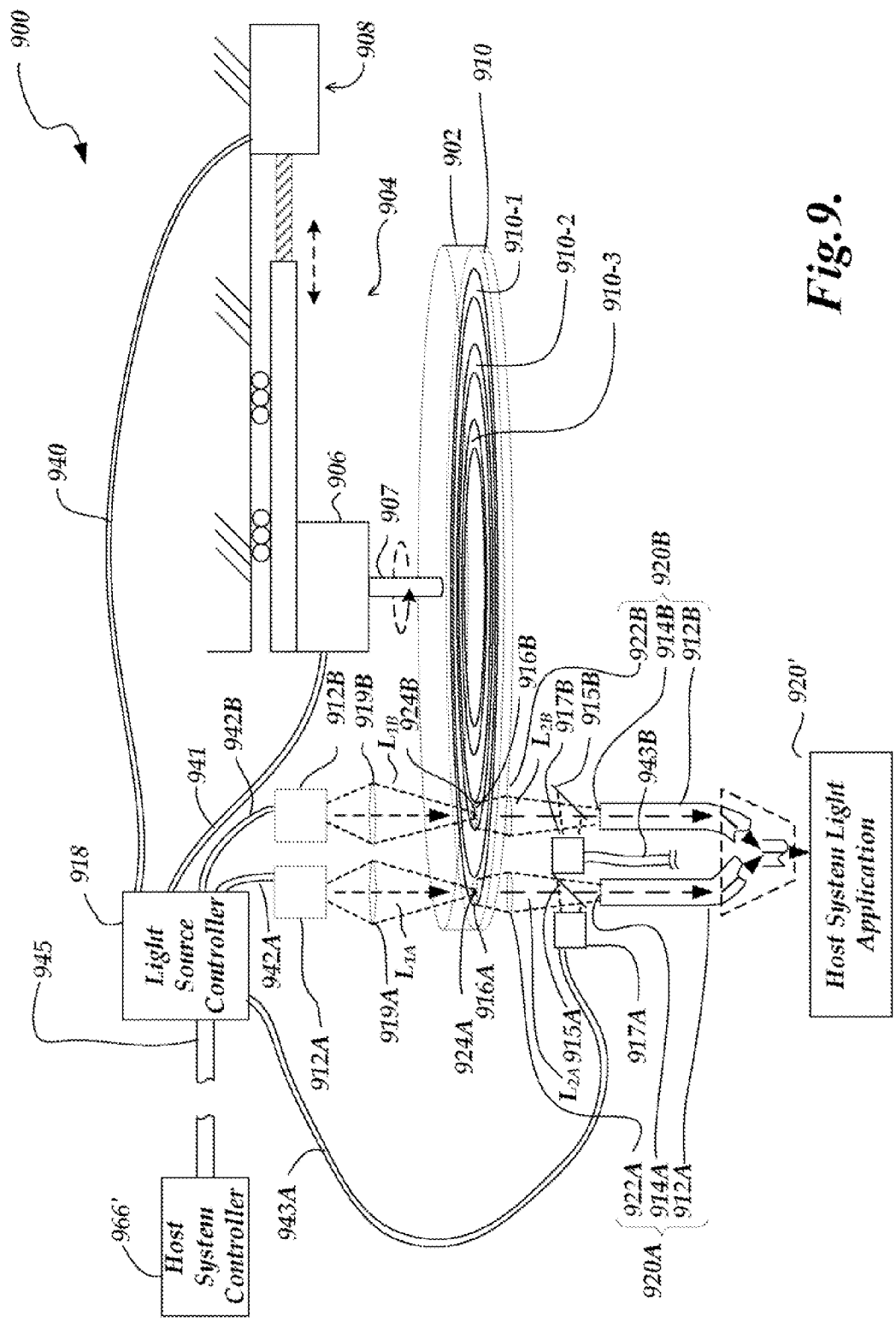
FIG. 9 is a diagram of a multi-wavelength light source configuration according to the invention which comprises a plurality of input light sources.

Similar to the phosphor region configuration 710, various wavelengths or combinations of wavelengths may be output from the multi-wavelength phosphor region configuration 810, depending on the control and synchronization of power in the illuminated spot 824 in relation to the position of the movable member 802. However, in this embodiment, the synchronization and control that is related to determining the output light wavelength(s) controls the radial location of the illumination spot (e.g., as controlled by the linear actuator 208, as previously outlined with reference to FIG. 2), rather than rotation angle. According to a first method of control and synchronization that provides output light from a single one of the sub-regions 810-X (e.g., restricted or "single band" output light having a unique peak wavelength λX), the input light source is controlled to provide power in the illuminated spot 824 only when the illuminated spot 824 coincides with a position inside the corresponding sub-region width SRWX of the sub-region 810-X. The phosphor region configuration 810 has an advantage over the phosphor region configuration 710 in that it may output light having a unique peak wavelength λX continuously for either a part of a revolution and/or any number of revolutions of the movable member 802. However, its disadvantage is that switching between different single bands of wavelengths is accomplished by radial motion of the movable member 802 or the illumination spot 824, which may be slower than the method of wavelength switching that can be used with the phosphor region configuration 710. FIG. 9 illustrates an embodiment that may mitigate this disadvantage.

FIG. 9 is a diagram of a light source configuration 900. The 9XX series numbers in FIG. 9 that have the same "XX" suffix as 6XX series numbers in FIG. 6, or the 8XX series numbers in FIGS. 8A and 8B, may designate similar or identical elements unless otherwise indicated. Thus, the operation of the light source configuration 900 may generally be understood by analogy with the description of previous figures, and only certain aspects of operation will be described here.

In general, the light source configuration 900 comprises means for providing two different input lights, which give rise to two different output lights from the light-emitting phosphor region 910. In particular, in the embodiment shown in FIG. 9, a first light source 912A is configured to illuminate one of the light-emitting phosphor sub-regions 910-1, 910-2 and 910-3 (e.g., the sub-region 910-1) with input light $L_{1A}$ at an illumination spot 924A to emit output light $L_{2A}$ and a second input light source 912B is configured to illuminate a different one of the light-emitting phosphor sub-regions 910-1, 910-2 and 910-3 (e.g., the sub-region 910-2) with input light $L_{1B}$ at an illumination spot 924B to emit output light $L_{2B}$. The operation associated with each instance of input light and output light may be similar, and may be understood by analogy with the description of similar elements in previous figures. In the embodiment illustrated in FIG. 9, the light source 912A illuminates phosphor sub-region 910-1 and the second light source 912B illuminates phosphor sub-region 910-2. The movable member 902 may be analogous to the movable member 802 of FIGS. 8A and 8B, and the sub-regions 910-1, 910-2, 910-3 may comprise different phosphor compositions that emit respective single band spectrums of light that have different peak wavelengths, as outlined previously. Thus, the light source configuration 900 may advantageously provide output lights L2A and L2B from different sub-regions without requiring radial motion (e.g., without using the linear actuator 908). This provides the capability to rapidly switch wavelengths of light by switching the active input from the input light source 912A to 912B or vice versa. In some embodiments, the output light $L_{2A}$ and the output light $L_{2B}$ may be combined through simultaneous illumination to create a desired combined spectral profile. Signals from the power sensors 917A and 917B may be used to control power in the associated output lights L2A and L2B according to desired levels and/or a desired relationship. In some embodiments, the output light $L_{2A}$ and the output light $L_{2B}$ may have the same spectrum, and may be combined for the purpose of increasing the power provided to the host system light application 920'. In other embodiments, additional different input lights and output lights may be provided, such that 3 or more output lights may be provided from different phosphor sub-regions. In other embodiments, the two of more different output lights may be provided through separate optical channels or fibers (not shown) to the host system light application 920'.

Figure 10:
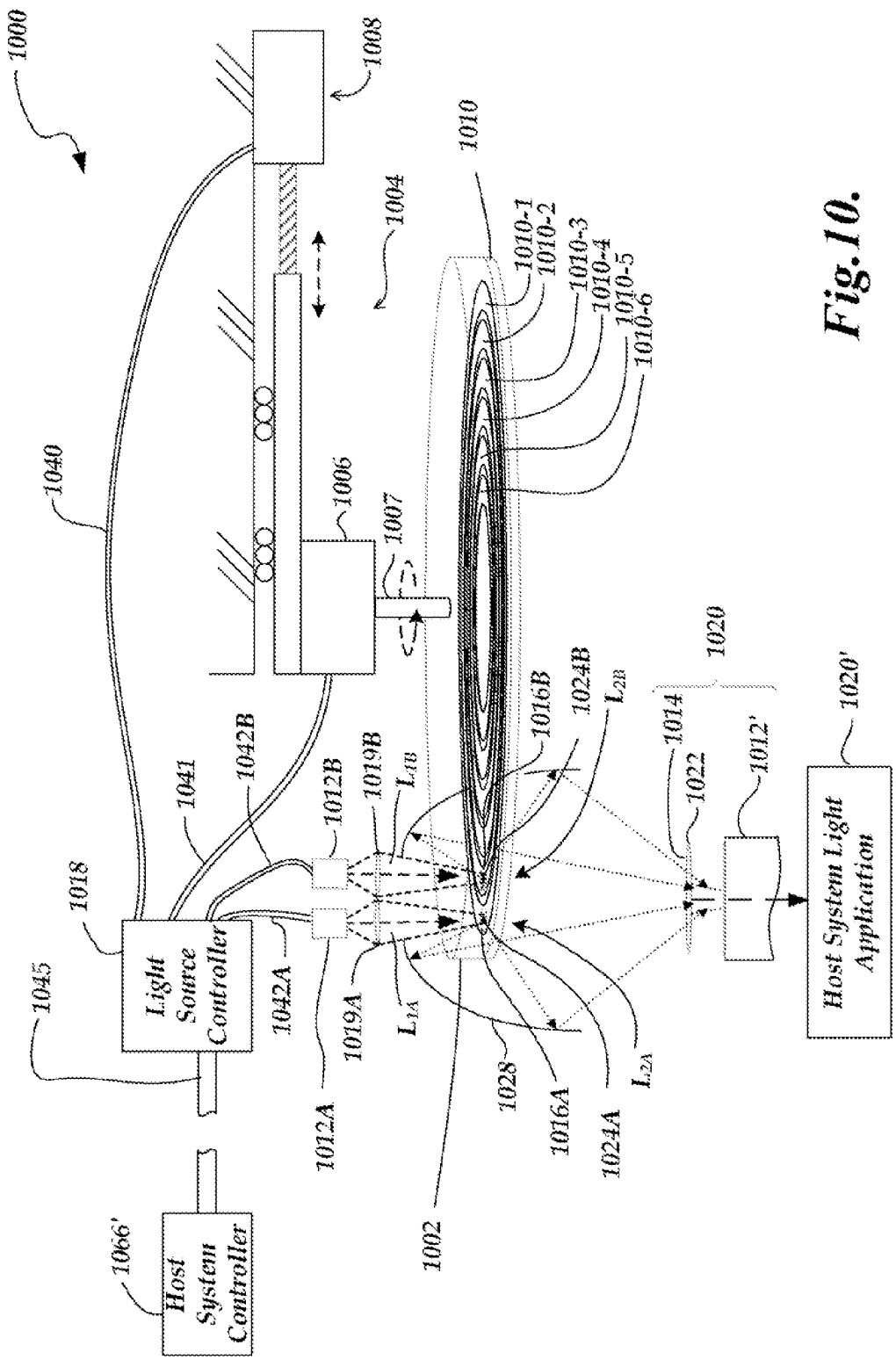
FIG. 10 is a diagram of a multi-wavelength light source configuration according to the invention which comprises a light gathering mirror arrangement for reflecting output light to the input end an optical fiber bundle that transmits the output light.

FIG. 10 is a diagram of a light source configuration 1000 which comprises a plurality of input light sources and a light gathering mirror 1028 for reflecting output light to be concentrated for input to the input end of an optical fiber bundle 1012'. The 10XX series numbers in FIG. 10 that have the same "XX" suffix as 9XX series numbers in FIG. 9 may designate similar or identical elements unless otherwise indicated. Thus, the operation of the light source configuration 1000 may generally be understood by analogy with the description of previous figures, and only certain aspects of operation will be described here.

Briefly, the major differences between the light source configuration 1000 and the light source configuration 900, and/or other previous embodiments, is that it includes the light gathering mirror 1028, and the output optical path 1020 may include either a single optical fiber, or the fiber bundle 1012' shown in FIG. 10. As previously outlined, the light gathering mirror 1028 is configured to collect output light that is emitted in various directions from the emitted light output coupling regions 1016A and 1016B, and reflect and concentrate that output light to be input to the optical fiber bundle 1012'. This configuration may therefore reduce wasted phosphor-emitted light and/or power in comparison to some previously described embodiments. In the particular embodiment shown in FIG. 10, the output light is concentrated to the lens 1022, which further focuses the light to the input end of the optical fiber bundle 1012'. However, in other embodiments, the lens 1022 may be omitted. It will be appreciated that a fiber bundle 1012' may offer a larger input end than a single optical fiber, making it easier to gather the output light into the fiber bundle 1012'. Also, the output of the fiber bundle 1012' (not shown) may be easily subdivided into a plurality of illumination output channels, if desired. The light gathering mirror 1028 is schematically illustrated in FIG. 10. In practice, access or clearance for the various light sources and their optical paths, as well as the movable member 1002 may be provided by slots, or the like, in the light gathering mirror 1028. The light gathering mirror and the output optical path elements may be oriented differently than illustrated relative to the movable member 1002, if desired.

In one embodiment, the light gathering mirror arrangement 1028 may be shaped and positioned such that it follows a portion of an ellipsoid shape with the emitted light output coupling regions 1016A and 1016B located proximate to a first focus of the ellipsoid and the input end of the optical fiber bundle 1012' located proximate to the second focus of the ellipsoid. In operation, as the output lights $L_{2A}$ and $L_{2B}$ radiate from emitted light output coupling regions 1016A and 1016B, the ellipsoid light gathering mirror arrangement 1028 may reflect and focus the output lights $L_{2A}$ and $L_{2B}$ on the input end of the optical fiber bundle 1012', in an efficient light gathering arrangement. In another embodiment, the light gathering mirror comprises an off-axis paraboloid mirror positioned to transfer the image of the illuminated spot to the entrance aperture of the output light path optical element. Various different light gathering mirrors may be configured to image the illuminated spot with a desired magnification (e.g., a magnification of 1 for a miniature system and/or a single output fiber, or a magnification of 10 for an output fiber bundle, and so on.) In any case, a light gathering mirror allows a higher proportion of light emitted from the movable member to be collected and directed through the entrance aperture In some embodiments, the separation distance (e.g., the center-to-center distance) between the illumination spots 1024A and 1024B is made small, such that the emitted light output coupling regions 1016A and 1016B are located proximate to one another. In such embodiments, the light gathering mirror 1028 may efficiently gather and concentrate the light from both of the emitted light output coupling regions 1016A and 1016B. In some advantageous embodiments the separation distance may be at most 500 microns, or 250 microns, or even less. It will be appreciated that a light gathering mirror arrangement may be combined with the features of various other embodiments disclosed herein. For example, the fiber bundle 1012' may be replaced by a single fiber, and/or more or less than two input light sources may be used. Thus, the embodiment shown on FIG. 10 is exemplary only, and not limiting.

Figure 11:
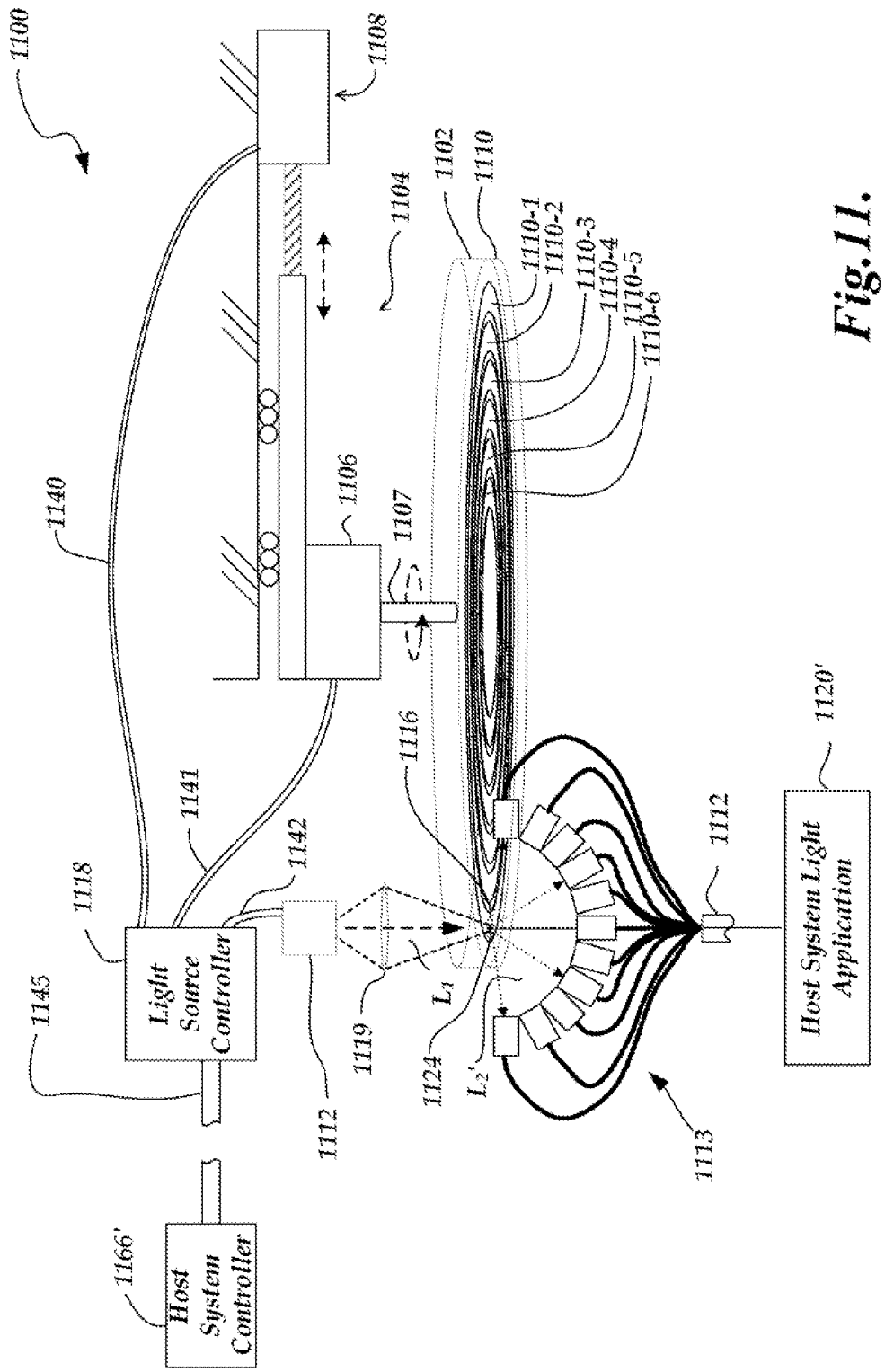
FIG. 11 is a diagram of a multi-wavelength light source configuration according to the invention which comprises a multi-fiber light gathering arrangement comprising a plurality of optical fiber input ends arranged for receiving and transmitting output light.

FIG. 11 is diagram of a light source configuration 1100 which comprises a multi-fiber light gathering arrangement 1113 comprising a plurality of optical fiber ends for receiving the output light L2'. The 11XX series numbers in FIG. 11 that have the same "XX" suffix as 6XX series numbers in FIG. 6 may designate similar or identical elements unless otherwise indicated. Thus, the operation of the light source configuration 1100 may generally be understood by analogy with the description of previous figures, and only certain aspects of operation will be described here.

Briefly, the multi-fiber light gathering arrangement 1113 comprises a plurality of optical fiber ends configured to receive the output light L2' that is emitted in various directions from the emitted light output coupling region 1116, and couple that light through a plurality of optical fibers to the output optical fiber 1112. Thus, similarly to the light source configuration 1000, this configuration may therefore reduce wasted phosphor-emitted light and/or power in comparison to some other previously described embodiments. The multi-fiber light gathering arrangement 1113 is schematically illustrated in FIG. 11. In practice, it may be configured and/or oriented differently than illustrated relative to the movable member 1002, if desired. Alternatively, the end of a multi-fiber bundle (e.g., comprising a large number of close-packed optical fibers) may be arranged to provide a similar function. Such a fiber bundle may be tapered and/or fused proximate to its output end to combine the light from the multiple fibers into a more compact fiber or set of fibers for output to the host system light application 1120'. It will be appreciated that a multi-fiber light gathering arrangement may be combined with the features of various other embodiments disclosed herein, if desired. Thus the embodiment shown in FIG. 11 is exemplary only, and not limiting.

While various exemplary embodiments have been illustrated and described, numerous variations in the illustrated and described arrangements of features and sequences of operations will be apparent to one skilled in the art based on this disclosure. For example, the shape and/or configuration of the movable member 202 is not limited to a disk that rotates around an axis, and may include any other shape that may rotate around an axis and/or any other shape that may be displaced linearly (e.g., a reciprocating movable member) relative to an input and output light location. As another example, while various embodiments of the light-emitting phosphor region are suitable for producing combined wavelengths of light and/or broadband light, in some embodiments some portion of the combined wavelengths of the light and/or broadband light may be originated from, or supplemented with, light from a separate light source, such as UV, blue, green, red, or near infrared LEDs, different from the input light source 212. Such light may be combined with the light emitted by the phosphor region according to known techniques (e.g., by using fiber couplers, or the like). As another example, in some embodiments, a plurality of input light sources (e.g., a plurality of diode lasers) may be configured to illuminate the light emitting phosphor region at adjacent or overlapping illuminated spots that are fixed relative to the emitted light output coupling region, to economically achieve higher intensities. Furthermore, it will be appreciated that the various exemplary dimensions outlined previously are particularly suitable for systems which benefit from small optical fiber diameters, compact construction and very short pulse durations. However, in other embodiments the fiber end may have a larger diameter (e.g., on the order of 250-2000 microns), and the illuminated spot may have a larger diameter (e.g., on the order of 10-2000 microns.) The light-emitting phosphor region may emit light from an excited phosphor spot that is larger than and surrounds the illuminated spot (e.g., with an excited spot diameter of 150-2000+ microns). The distance from the illuminated spot and/or the portion of the emitted light output coupling region that is nearest to the entrance aperture of an output light path optical element set (e.g., the aperture defined by a collection optics lens or an output fiber end) may be set on the order of 2 millimeters, or 1 millimeter, or less. However, it will be appreciated that other systems may use dimensions other than those outlined above. Furthermore, although pulsed illumination operation has been emphasized, it will be appreciated that continuous illumination may be provided in various embodiments. Thus, it will be appreciated that various changes according to the teachings herein can be made to the various particular embodiments outlined above without departing from the spirit and scope of the invention.

The embodiments of the invention in which an exclusive property or privilege is claimed are defined as follows:

1. A light source configuration comprising:
   a movable member connected to a movable member actuator;
   at least one light-emitting phosphor region associated with the movable member;
   a first input light source configured to illuminate the at least one light-emitting phosphor region with input light at a first illuminated spot that is fixed relative to a first emitted light output coupling region; and
   a light source controller operably connected to the movable member actuator and the first input light source,
   wherein:
   the at least one light-emitting phosphor region associated with the movable member is distributed over an area of at least 25 times a nominal area of the first emitted light output coupling region, and the at least one light-emitting phosphor region is configured to emit light in the first emitted light output coupling region in response to the input light at the first illuminated spot; and
   the light source configuration is configured to move the at least one light-emitting phosphor region across the first illuminated spot while the at least one light-emitting phosphor region is emitting light in the first emitted light output coupling region in response to the input light at the first illuminated spot.

2. The light source configuration of claim 1, wherein the light source configuration is configured to move the at least one light-emitting phosphor region across the first illuminated spot at one or more speeds, while the at least one light-emitting phosphor region is emitting light in the first emitted light output coupling region in response to the input light at the first illuminated spot, including a speed of at least 2.5 m/s.

3. The light source configuration of claim 2, wherein the one or more speeds includes a speed of at least 7.5 m/s.

4. The light source configuration of claim 2, wherein the first illuminated spot has a nominal spot diameter of at most 500 microns.

5. The light source configuration of claim 4, wherein the light source configuration is configured such that the light source controller controls the first input light source to provide a spatial average of the light intensity of the first illuminated spot as high as at least 20 milliwatts per square millimeter.

6. The light source configuration of claim 5, wherein the light source configuration is configured such that the light source controller controls the first input light source to provide a spatial average of the light intensity of the first illuminated spot as high as at least 2000 milliwatts per square millimeter.

7. The light source configuration of claim 6, wherein the first illuminated spot has a nominal spot diameter of at most 100 microns.

8. The light source configuration of claim 1, wherein:
   the light source configuration is configured such that the light source controller controls the first input light source to provide at least one pulse duration; and
   the at least one pulse duration includes a pulse duration that is at most 50 microseconds.

9. The light source configuration of claim 1, further comprising a first output light path optical element set, wherein:
   an entrance aperture of the first output light path optical element set is located to receive light from the first emitted light output coupling region;
   the first output light path optical element set comprises a first output optical fiber; and
   the entrance aperture of the first output light path optical element set comprises one of an aperture associated with a lens that transmits light to the first output optical fiber and an aperture associated with a light carrying core area at the end of the first output optical fiber.

10. The light source configuration of claim 9, wherein the entrance aperture of the first output light path optical element set is located at most 2.0 millimeter from the nearest portion of the at least one light-emitting phosphor region.

11. The light source configuration of claim 10, wherein the entrance aperture of the first output light path optical element set comprises the aperture associated with the light carrying core area at the end of the first output optical fiber.

12. The light source configuration of claim 9, wherein:
   the first input light source comprises a first input light generator that generates the input light and a first input light path optical element set that carries the light from the first input light generator to an exit aperture of the first input light path optical element set, the exit aperture illuminating the at least one light-emitting phosphor region at the first illuminated spot;

the first input light path optical element set comprises a first input optical fiber; and the exit aperture of the first input light path optical element set comprises one of an aperture associated with a lens that transmits light from the first input optical fiber and an aperture associated with a light carrying core area at the end of the first input optical fiber.

13. The light source configuration of claim 12, wherein:

the exit aperture of the first input light path optical element set and the entrance aperture of the first output light path optical element set are located on the same side of the at least one light-emitting phosphor region;

the first input optical fiber and the first output optical fiber comprise a same optical fiber segment; and the exit aperture of the first input light path optical element set and the entrance aperture of the first output light path optical element set are the same aperture.

14. The light source configuration of claim 1, wherein:

the first emitted light output coupling region is nominally circular and has a dimension DR;

the at least one light-emitting phosphor region includes a phosphor that has emission time of approximately TE; and the light source configuration is configured such that the at least one light-emitting phosphor region moves across the first illuminated spot at a speed that is at most DR/TE and at least DR/(2*TE).

15. The light source configuration of claim 1, wherein:

the at least one light-emitting phosphor region includes a phosphor that has emission time of approximately TE;

the light source configuration is configured such that the light source controller controls the first input light source to provide at least one pulse duration; and the at least one pulse duration includes a pulse duration less than TE.

16. The light source configuration of claim 1, wherein the light source configuration is included in a host system comprising a chromatic point sensor.

17. The light source configuration of claim 1, wherein the at least one light-emitting phosphor region comprises a phosphor region that emits broadband light in response to the input light at the first illuminated spot.

18. The light source configuration of claim 1, wherein the at least one light-emitting phosphor region comprises a plurality of respective light-emitting phosphor sub-regions which emit light with different respective peak wavelengths in response to receiving the input light at the first illuminated spot.

19. The light source configuration of claim 18, wherein each respective light-emitting phosphor sub-region is distributed over an area of at least 25 times the nominal area of the first emitted light output coupling region.

20. The light source configuration of claim 18, wherein:

the movable member actuator is operable to rotate the moveable member about a rotation axis; and the respective light-emitting phosphor sub-regions comprise a first sub-region comprising an area arranged at a first radius from the rotation axis and over a first angular range AR1 about the rotation axis, and a second sub-region comprising an area arranged at the first radius from the rotation axis and over a second angular range AR2 about the rotation axis, such that rotation of the moveable member moves the first and second sub-regions sequentially across a location where the first illuminated spot occurs.

21. The light source configuration of claim 18, wherein:

the movable member actuator is configured to rotate the moveable member about the rotation axis with an angular velocity $\omega$;

the light source controller is configured to control the first input light source to provide at least one pulse duration that is less than $AR1/\omega$;

the light source controller is configured to control the first input light source to synchronize the at least one pulse duration that is less than $AR1/\omega$ with the rotation of the moveable member such that when it occurs the first illuminated spot falls within the angular range AR1; and the light source configuration is operable to emit light having the respective peak wavelength corresponding to the first sub-region over one or more rotations of the movable member without emitting light corresponding to any other light-emitting phosphor sub-regions.

22. The light source configuration of claim 18, wherein:

the movable member actuator is operable to rotate the moveable member about a rotation axis; and the respective light-emitting phosphor sub-regions comprise a first sub-region comprising an area arranged at a first radius from the rotation axis and over 360 degrees about the rotation axis, and a second sub-region comprising an area arranged at a second radius from the rotation axis and over 360 degrees about the rotation axis.

23. The light source configuration of claim 21, wherein:

the movable member actuator is operable to translate the movable member along a direction perpendicular to the rotation axis; and translation of the moveable member along the direction perpendicular to the rotation axis moves the first and second sub-regions sequentially across the location where the first illuminated spot occurs.

24. The light source configuration of claim 21, further comprising:

a second input light source connected to the light source controller and configured to illuminate the at least one light-emitting phosphor region with input light at a second illuminated spot that is fixed relative to a second emitted light output coupling region;

a first output light path optical element set comprising a respective entrance aperture that is located to receive light from the first emitted light output coupling region and transmit that light through an optical fiber of the first output light path optical element set; and a second output light path optical element set comprising a respective entrance aperture that is located to receive light from the second emitted light output coupling region and transmit that light through an optical fiber of the second output light path optical element set, wherein:

the light source configuration is configured such that the first illuminated spot may be positioned to coincide with the first sub-region and the first sub-region may emit light having the respective peak wavelength corresponding to the first sub-region at the same time that the second illuminated spot is positioned to coincide with the second sub-region and the second sub-region emits light having the respective peak wavelength corresponding to the second sub-region.

25. The light source configuration of claim 24, wherein an optical fiber of the first output light path optical element set and an optical fiber of the second output light path optical element set comprise the same optical fiber.

26. The light source configuration of claim 1, further comprising a beamsplitter and a power sensor, wherein:
   the beamsplitter is arranged to receive a portion of the light emitted from the first emitted light output coupling region in response to the input light at the first illuminated spot, and to direct a portion of the received light to the power sensor; and
   the light source controller is configured to control the power of the input light at the first illuminated spot based on a signal provided by the power sensor.

27. The light source configuration of claim 1, wherein the light source configuration comprises a light gathering arrangement comprising a light gathering mirror that generally surrounds the first emitted light output coupling region and concentrates light emitted from the first emitted light output coupling region proximate to an entrance aperture of a first output light path optical element set.

28. The light source configuration of claim 27, wherein the light gathering mirror comprises an ellipsoidal mirror, and the light source configuration includes positioning with the first illuminated spot proximate to one focus of the ellipsoidal mirror and the entrance aperture of the first output light path optical element set proximate to the other focus of the ellipsoidal mirror.

29. The light source configuration of claim 1, wherein the light source configuration comprises a light gathering arrangement comprising a light gathering optical fiber arrangement comprising a plurality of optical fibers having their input ends arranged at different positions to receive light emitted along a plurality of directions from the first emitted light output coupling region.

30. The light source configuration of claim 1, further comprising a second input light source connected to the light source controller and configured to illuminate the at least one light-emitting phosphor region with input light at the first illuminated spot that is fixed relative to the first emitted light output coupling region, such that the input light from the first and second input light sources provides a combined intensity at the first illuminated spot.

31. The light source configuration of claim 1, wherein:
   the movable member actuator is operable to rotate the moveable member about a rotation axis;
   the movable member has a maximum dimension that is at most 50 millimeters along a direction perpendicular to the rotations axis; and
   the light source configuration is configured to move the at least one light-emitting phosphor region across the first illuminated spot at one or more speeds, while the at least one light-emitting phosphor region is emitting light in the first emitted light output coupling region in response to the input light at the first illuminated spot, including a speed of at least 2.5 m/s.

32. A method for operating a light source configuration, the light source configuration comprising a movable member connected to a movable member actuator; a at least one light-emitting phosphor region associated with the movable member; an input light source configured to illuminate the at least one light-emitting phosphor region with input light at an illuminated spot that is fixed relative to an emitted light output coupling region; and a light source controller operably connected to the movable member actuator and the input light source, the method comprising the steps of:
   providing the light source configuration, including providing a movable member configured such that the at least one light-emitting phosphor region is distributed on the movable member over an area of at least 25 times a nominal area of the emitted light output coupling region;
   operating the light source configuration to illuminate the at least one light-emitting phosphor region with input light at the illuminated spot such that the at least one light-emitting phosphor region emits light in the emitted light output coupling region in response to the input light at the illuminated spot; and
   operating the light source configuration to move the at least one light-emitting phosphor region across the illuminated spot while the at least one light-emitting phosphor region is emitting light in the emitted light output coupling region.

33. The method of claim 32, wherein operating the light source configuration to move the at least one light-emitting phosphor region across the illuminated spot comprises moving the at least one light-emitting phosphor region relative to the illuminated spot at a speed that is at least 2.5 m/s.

34. The method of claim 32, further comprising operating the movable member actuator to move the at least one light-emitting phosphor region relative to the illuminated spot such that the illuminated spot traverses a first track along the at least one light-emitting phosphor region during a first operating period of the light source configuration and such that the illuminated spot traverses a second track along the at least one light-emitting phosphor region during a second operating period of the light source configuration, wherein the second track is different than the first track.

35. The method of claim 32, wherein the light source configuration is configured such that the illuminated spot has a nominal spot diameter of at most 2.0 millimeters.

36. The method of claim 32, further comprising operating the light source configuration such that the light source controller controls the input light source to provide at least one pulse duration, and the at least one pulse duration includes a pulse duration that is at most 50 microseconds.

37. The method of claim 32, further comprising operating the light source configuration to provide light to a host system comprising a chromatic point sensor.

\* \* \* \* \*